United States Patent
McNutt et al.

(10) Patent No.: US 9,922,754 B1
(45) Date of Patent: *Mar. 20, 2018

(54) COMMUNICATION CABLES INCORPORATING TWISTED PAIR COMPONENTS

(71) Applicant: Superior Essex International LP, Atlanta, GA (US)

(72) Inventors: Christopher W. McNutt, Woodstock, GA (US); Amir Sekhavat, Marietta, GA (US)

(73) Assignee: Superior Essex International LP, Atlanta, GA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/647,394

(22) Filed: Jul. 12, 2017

Related U.S. Application Data

(63) Continuation of application No. 15/155,564, filed on May 16, 2016, now Pat. No. 9,734,940.

(51) Int. Cl.
   - *H01B 11/10* (2006.01)
   - *H01B 7/295* (2006.01)
   - *H05K 7/20* (2006.01)

(52) U.S. Cl.
   CPC ......... *H01B 11/1033* (2013.01); *H01B 7/295* (2013.01); *H05K 7/2039* (2013.01)

(58) Field of Classification Search
   CPC ......... H01B 11/02; H01B 11/04; H01B 11/06; H01B 11/10
   See application file for complete search history.

(56) References Cited

U.S. PATENT DOCUMENTS

| | | | |
|---|---|---|---|
| 3,143,593 A | 8/1964 | Toto | |
| 3,989,884 A | 11/1976 | Friedrich et al. | |
| 4,166,920 A | 9/1979 | Friedrich et al. | |
| 4,755,629 A | 7/1988 | Beggs | |
| 5,442,131 A | 8/1995 | Borgwarth | |
| 6,074,503 A * | 6/2000 | Clark | H01B 11/08 156/47 |
| 6,248,954 B1 * | 6/2001 | Clark | H01B 11/04 174/113 R |
| 6,639,152 B2 | 10/2003 | Glew et al. | |
| 7,135,655 B2 | 11/2006 | Tomiyasu et al. | |
| 7,238,886 B2 | 7/2007 | Wiekhorst et al. | |

(Continued)

OTHER PUBLICATIONS

Non-Final Office Action for U.S. Appl. No. 15/155,564 dated Oct. 3, 2016.

(Continued)

*Primary Examiner* — Timothy Thompson
*Assistant Examiner* — Amol Patel

(57) ABSTRACT

Communication cables incorporating a plurality of twisted pair components formed around a central member are described. A central member may extend lengthwise along a longitudinal length of a cable, and the central member may include a channel extending lengthwise that defines a longitudinal cavity through the central member. A plurality of unjacketed twisted pair components may be formed around the central member, and each component may include a plurality of twisted pairs of individually insulated electrical conductors Further, a jacket may be formed around the central member and the plurality of twisted pair components.

20 Claims, 14 Drawing Sheets

(56) References Cited

U.S. PATENT DOCUMENTS

| | | |
|---|---|---|
| 7,405,360 B2 | 7/2008 | Clark |
| 7,473,850 B2 | 1/2009 | Glew |
| 7,663,061 B2 | 2/2010 | Gareis |
| 8,313,346 B2 | 11/2012 | Sparrowhawk |
| 8,558,115 B2 | 10/2013 | Jenner |
| 8,624,116 B2 | 1/2014 | Wiekhorst et al. |
| 8,641,844 B2 | 2/2014 | Juengst |
| 2003/0205402 A1* | 11/2003 | Koyasu ............ H01B 11/04 174/113 C |
| 2005/0168941 A1 | 8/2005 | Sokol et al. |
| 2010/0200269 A1* | 8/2010 | Camp, II ............ H01B 11/04 174/113 C |
| 2010/0236812 A1* | 9/2010 | Laudenslager ...... H01B 11/085 174/113 R |
| 2011/0174531 A1* | 7/2011 | Rubera ............ H01B 11/06 174/350 |
| 2011/0259626 A1* | 10/2011 | Speer ............ H01B 11/10 174/113 C |
| 2013/0248240 A1 | 9/2013 | Glew et al. |
| 2014/0251652 A1 | 9/2014 | Poulson et al. |

OTHER PUBLICATIONS

Non-Final Office Action for U.S. Appl. No. 15/098,626 dated May 26, 2017.
Non-Final Office Action for U.S. Appl. No. 15/098,635 dated May 26, 2017.
Office Action for U.S. Appl. No. 15/098,635 dated Sep. 28, 2017.
Notice of Allowance and Fees Due for U.S. Appl. No. 15/098,626 dated Oct. 13, 2017.
Notice of Allowance and Fees Due for U.S. Appl. No. 15/155,564 dated Apr. 20, 2017.

* cited by examiner

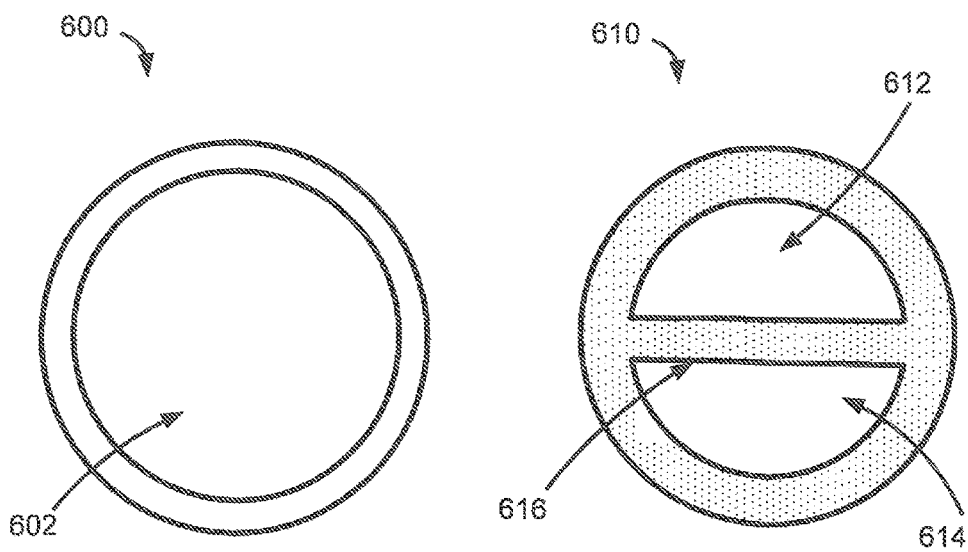
FIG. 6A
FIG. 6B
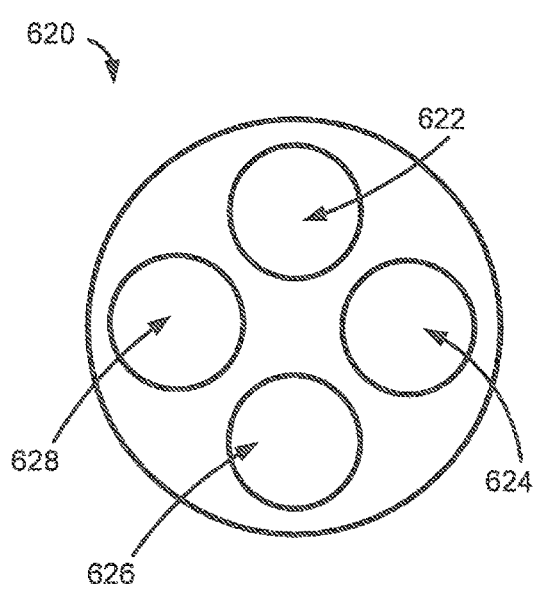
FIG. 6C
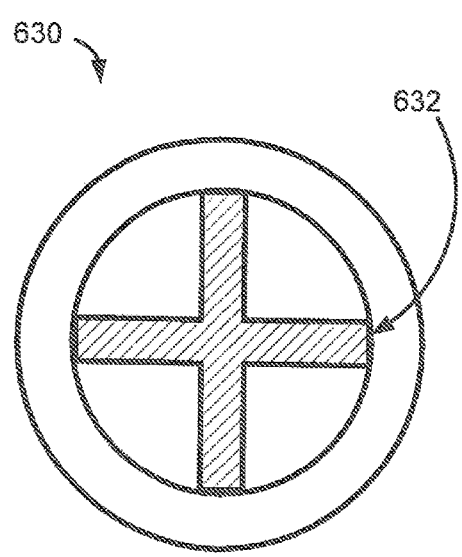
FIG. 6D

COMMUNICATION CABLES INCORPORATING TWISTED PAIR COMPONENTS

CROSS-REFERENCES TO RELATED APPLICATIONS

This application is a continuation of pending U.S. patent application Ser. No. 15/155,564, filed May 16, 2016, and entitled "Communication Cables Incorporating Twisted Pair Components", which is incorporated by reference herein in its entirety. Additionally, this application is related to pending U.S. patent application Ser. No. 15/098,626, filed Apr. 14, 2016 and entitled "Communication Cables Incorporating Twisted Pair Separators with Cooling Channels"; and U.S. patent application Ser. No. 15/098,635, filed Apr. 14, 2016 and entitled "Communication Cables Incorporating Twisted Pair Separators." The contents of each of these applications is incorporated herein by reference in its entirety.

TECHNICAL FIELD

Embodiments of the disclosure relate generally to communication cables and, more particularly, to cables incorporating a plurality of unjacketed twisted pair components formed around a central member of other components that assists in cooling the cable.

BACKGROUND

A wide variety of different types of communication cables incorporate twisted pair conductors. In a wide variety of applications, when a twisted pair cable is installed and utilized, relatively higher amounts of heat may be generated in certain portions of the cable. For example, with a cable installed in a data center, portions of the cable situated in relatively close proximity to electronic equipment and/or equipment cabinets (e.g., portions of the cable near terminating ends) may become hotter than other portions of the cable. Additionally, electronic equipment connected to or near the termination ends of the cable may generate heat. The heat may negatively impact both the electrical performance of the cable and the performance of electronic equipment associated with the cable. Further, when a plurality of twisted pair cables are used in relatively close proximity to one another, relatively higher amounts of heat may be generated, thereby exacerbating electrical performance issues. Accordingly, there is an opportunity for improved cables that provide for heat transfer that assists in cooling the cable and/or any associated electronic equipment.

BRIEF DESCRIPTION OF THE DRAWINGS

The detailed description is set forth with reference to the accompanying figures. In the figures, the left-most digit(s) of a reference number identifies the figure in which the reference number first appears. The use of the same reference numbers in different figures indicates similar or identical items; however, various embodiments may utilize elements and/or components other than those illustrated in the figures. Additionally, the drawings are provided to illustrate example embodiments described herein and are not intended to limit the scope of the disclosure.

FIGS. 6A-6H are cross-sectional views of example central members that may be incorporated into cables in accordance with various illustrative embodiments of the disclosure.

DETAILED DESCRIPTION

Figure 1:
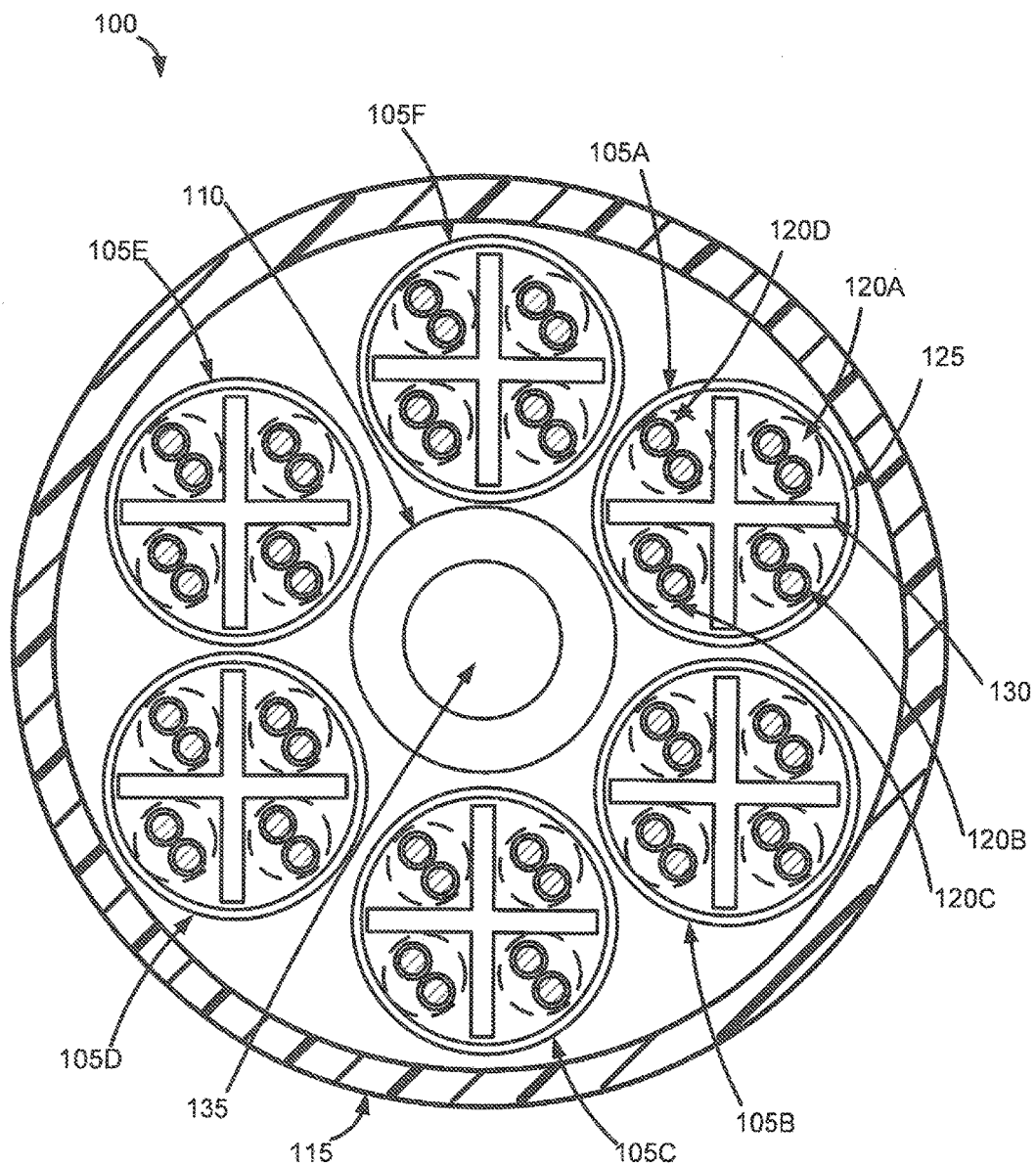
FIGS. 1-3 are cross-sectional views of example cables that include a plurality of twisted pair components formed around a central cooling member, according to illustrative embodiments of the disclosure.

Various embodiments of the present disclosure are directed to cables that include a plurality of twisted pair components formed or positioned around a cooling tube or central member. A cable jacket may be formed around the plurality of twisted pair components and the central member; however, in certain embodiments, the plurality of twisted pair components may be unjacketed. In other words, a plurality of unjacketed twisted pair cores, such as the cores incorporated into Ethernet or data cables (e.g., Category 5, Category 5e, Category 6, Category 6A. Category 8, etc.) may be formed around a central member that assists in cooling the cores. When installed in a suitable environment, heat generated by and/or in the various twisted pair cores or components may be dissipated, transferred, and/or otherwise mitigated by the central member. For example, when installed in a data center, heat may be transferred or mitigating, thereby improving the electrical performance of the cable. As another example, when the cable is utilized to transfer power such as in power over Ethernet applications, the heat transfer cooling effect may facilitate improved cable performance (e.g., a higher power rating, etc.).

Each of the plurality of twisted pair components or cores may include a plurality of twisted pairs of individually insulated conductors and at least one optional shield layer. Additionally, each shield layer may be formed around one or more of the twisted pairs included in a twisted pair component. For example, each twisted pair may be individually shielded and/or an overall shield may be formed around the plurality of twisted pairs in component. Due to the unjacketed nature of the twisted pair components, one or more of the shield layers incorporated into a twisted pair component may contact or be positioned immediately adjacent to the central member. In operation, the shield layers may function as heat sinks that draw heat away from the twisted pair conductors, and the heat may be more readily transferred to the central member.

The central member may be formed with a wide variety of suitable cross-sectional shapes and/or dimensions. According to an aspect of the disclosure, the central member may include at least one longitudinally extending channel that defines a lengthwise cavity through the central member. In various embodiments, fluid may be positioned within the channel, such as air, other gas(es), one or more coolant(s), or other suitable fluids. The at least one longitudinally extending channel (also referred to as the longitudinal channel) may assist in convective heat transfer along a longitudinal length of the cable. As portions of the cable and/or the various twisted pair components heat up, the fluid within the longitudinal channel may transfer heat from the relatively warmer or hotter portions along the longitudinal length of the cable. In certain embodiments, the convective heat transfer may occur based primarily on temperature fluctuations within the cable and/or the longitudinal channel. In other embodiments, heat sinks may be incorporated into the longitudinal channel and/or other components of the central member in order to improve the convective heat transfer. In yet other embodiments, one or more fans and/or circulation systems may be connected to the cable to improve heat transfer. The convective heat transfer may facilitate or assist in normalization of the temperature along the longitudinal length of the cable. As a result, in certain embodiments, the electrical performance of the cable and/or electronic equipment associated with the cable may be improved.

In certain embodiments, the central member may additionally include one or more second channels that extend from a longitudinal channel through the central member, for example, to an outer surface of the central member. These second channels may further facilitate convective heat transfer via the central member. As discussed in greater detail below, any number, configurations, and/or arrangements of second channels may be utilized. As desired in various embodiments, a central member may additionally provide electromagnetic shielding for one or more of the twisted pair components. A wide variety of different types of materials may be utilized to provide shielding, such as electrically conductive material, semi-conductive material, and/or dielectric shielding material. Additionally, shielding material may be incorporated into the central member at a wide variety of locations, for example, on one or more surfaces and/or embedded within the central member. In certain embodiments, the central member may even be formed from a material that provides shielding. In other embodiments, either continuous shielding material or a plurality of discontinuous patches of shielding material may be formed on one or more surfaces of the central member, such as an external surface of the central member, on a surface of a cavity defined by the longitudinal channel, and/or within one or more second channels. A wide variety of suitable configurations and/or patterns of electrically conductive material may be formed as desired in various embodiments.

Embodiments of the disclosure now will be described more fully hereinafter with reference to the accompanying drawings, in which certain embodiments of the disclosure are shown. This invention may, however, be embodied in many different forms and should not be construed as limited to the embodiments set forth herein, rather, these embodiments are provided so that this disclosure will be thorough and complete, and will fully convey the scope of the invention to those skilled in the art. Like numbers refer to like elements throughout.

Example Cable Constructions

With reference to FIG. 1, a cross-section of an example cable 100 that may be utilized in various embodiments is illustrated. The cable 100 is illustrated as a twisted pair communications cable; however, other types of cables may be utilized, such as composite or hybrid cables that include a combination of twisted pairs and other transmission media (e.g., optical fibers, etc.). Indeed, suitable cables may include any number of transmission media including but not limited to one or more twisted pairs, optical fibers, coaxial cables, and/or power conductors. Additionally, embodiments of the disclosure may be utilized in association with horizontal cables, vertical cables, flexible cables, equipment cords, plenum cables, riser cables, or any other appropriate cables.

As shown in FIG. 1, the cable 100 may include a plurality of twisted pair components 105A-F arranged or positioned around a central member 110. The central member 110 may facilitate convective heat transfer within the cable, thereby assisting in cooling and/or normalizing the temperature of the twisted pair components. An outer jacket 115 may then be formed around the twisted pair components 105A-F and the central member 110. The cable 100 of FIG. 1 includes six twisted pair components 105A-F formed around the central member 110. In this six around one design, the central member 110 may have a size (e.g., diameter, cross-sectional area, etc.) that is approximately equal to that of each of the twisted pair components 105A-F. In other embodiments, other arrangements and/or dimensions may be utilized for the central member 110 and twisted pair components 105A-F. Additionally, components other than twisted pair components may be arranged or positioned around the central member 110. Each of the components illustrated in FIG. 1 is described in greater detail below.

Any number of twisted pair components, such as the illustrated six twisted pair components 105A-F may be incorporated into the cable 100. Additionally, in certain embodiments, the twisted pair components 105A-F may be formed or positioned around the central member 110 at any given cross-sectional point along a longitudinal length of the cable. For example, the twisted pair components 105A-F may be stranded or helically twisted about the central member 110 with a wide variety of suitable pitches or twist lays. For example, in certain embodiments, the twisted pair components 105A-F may be stranded around the central member 110 with a twist lay between approximately 150 mm and approximately 1800 mm.

Although the cable 100 of FIG. 1 illustrates a single layer or ring of twisted pair components 105A-F formed around the central member 100, in other embodiments, a plurality of layers or rings of twisted pair components may be incorporated into the cable 100. Additionally or alternatively, in certain embodiments, components other than twisted pair components may be incorporated into a cable. For example, optical fiber cable components, coaxial cable components, power cable components, spacers, and/or a wide variety of other suitable components may be incorporated into one or more layers that are stranded around the central member 110.

In certain embodiments, each of the twisted pair components 105A-F may include components similar to a conventional twisted pair cable, such as a conventional four pair cable; however, the twisted pair components 105A-F may be formed without outer jackets. Accordingly, each of the twisted pair components may be similar to a core of a conventional twisted pair cable. An example twisted pair component, twisted pair subunit, or twisted pair core (generally referred to as twisted pair component 105 or core 105) may include a plurality of twisted pairs 120A-D and at least one shield layer 125. In certain embodiments, an overall shield layer 125 may be formed around the plurality of twisted pairs 120A-D. In other embodiments, individual shield layers may be respectively formed around each of the twisted pairs 120A-D and/or shield layers may be formed around one or more groups of twisted pairs 120A-D. Indeed, a wide variety of suitable shielding arrangements and/or combinations of shielding arrangements may be utilized. Additionally, given the unjacketed nature of the twisted pair component 105, (at least for a twisted pair component incorporated into an inner ring formed around the central member 110) one or more shield layers incorporated into the twisted pair component 105 may contact the central member 110.

Although the twisted pair component 105 is illustrated as having four twisted pairs 105A, 105B, 105C, 105D, any other suitable number of pairs may be utilized. As desired, the twisted pairs 105A-D may be twisted or bundled together and/or suitable bindings may be wrapped around the twisted pairs 105A-D. In other embodiments, multiple grouping of twisted pairs may be incorporated into a twisted pair component 105. As desired, each grouping may be twisted, bundled, and/or bound together. Further, in certain embodiments, the multiple groupings may be twisted, bundled, or bound together.

Each twisted pair (referred to generally as twisted pair 120 or collectively as twisted pairs 120) may include two electrical conductors, each covered with suitable insulation. Each twisted pair 120 can carry data or some other form of information, for example in a range of about one to ten Giga bits per second ("Gbps") or another appropriate frequency, whether faster or slower. As desired, each of the twisted pairs may have the same twist lay length or alternatively, at least two of the twisted pairs may include a different twist lay length. For example, each twisted pair may have a different twist rate. The different twist lay lengths may function to reduce crosstalk between the twisted pairs. A wide variety of suitable twist lay length configurations may be utilized. Additionally, in certain embodiments, each of the twisted pairs 120A-D may be twisted in the same direction (e.g., clockwise, counter clockwise). In other embodiments, at least two of the twisted pairs 120A-D may be twisted in opposite directions. Further, as desired in various embodiments, one or more of the twisted pairs 120A-D may be twisted in the same direction as an overall bunch lay of the combined twisted pairs. In other embodiments, at least one of the twisted pairs 120A-D may have a pair twist direction that is opposite that of the overall bunch lay.

The electrical conductors of a twisted pair 120 may be formed from any suitable electrically conductive material, such as copper, aluminum, silver, annealed copper, gold, a conductive alloy, etc. Additionally, the electrical conductors may have any suitable diameter, gauge, and/or other dimensions. Further, each of the electrical conductors may be formed as either a solid conductor or as a conductor that includes a plurality of conductive strands that are twisted together.

The twisted pair insulation may include any suitable dielectric materials and/or combination of materials, such as one or more polymeric materials, one or more polyolefins (e.g., polyethylene, polypropylene, etc.), one or more fluoropolymers (e.g., fluorinated ethylene propylene ("FEP"), melt processable fluoropolymers, MFA, PFA, ethylene tetrafluoroethylene ("ETFE"), ethylene chlorotrifluoroethylene ("ECTFE"), etc.), one or more polyesters, polyvinyl chloride ("PVC"), one or more flame retardant olefins (e.g., flame retardant polyethylene ("FRPE"), flame retardant polypropylene ("FRPP"), a low smoke zero halogen ("LSZH") material, etc.), polyurethane, neoprene, cholorosulphonated polyethylene, flame retardant PVC, low temperature oil resistant PVC, flame retardant polyurethane, flexible PVC, or a combination of any of the above materials. Additionally, in certain embodiments, the insulation of each of the electrical conductors utilized in the twisted pairs 120A-D may be formed from similar materials. In other embodiments, at least two of the twisted pairs may utilize different insulation materials. For example, a first twisted pair may utilize an FEP insulation while a second twisted pair utilizes a non-FEP polymeric insulation. In yet other embodiments, the two conductors that make up a twisted pair may utilize different insulation materials.

In certain embodiments, the insulation may be formed from multiple layers of one or a plurality of suitable materials. In other embodiments, the insulation may be formed from one or more layers of foamed material. As desired, different foaming levels may be utilized for different twisted pairs in accordance with twist lay length to result in insulated twisted pairs having an equivalent or approximately equivalent overall diameter. In certain embodiments, the different foaming levels may also assist in balancing propagation delays between the twisted pairs. As desired, the insulation may additionally include other materials, such as a flame retardant materials, smoke suppressant materials, etc.

Figure 2:
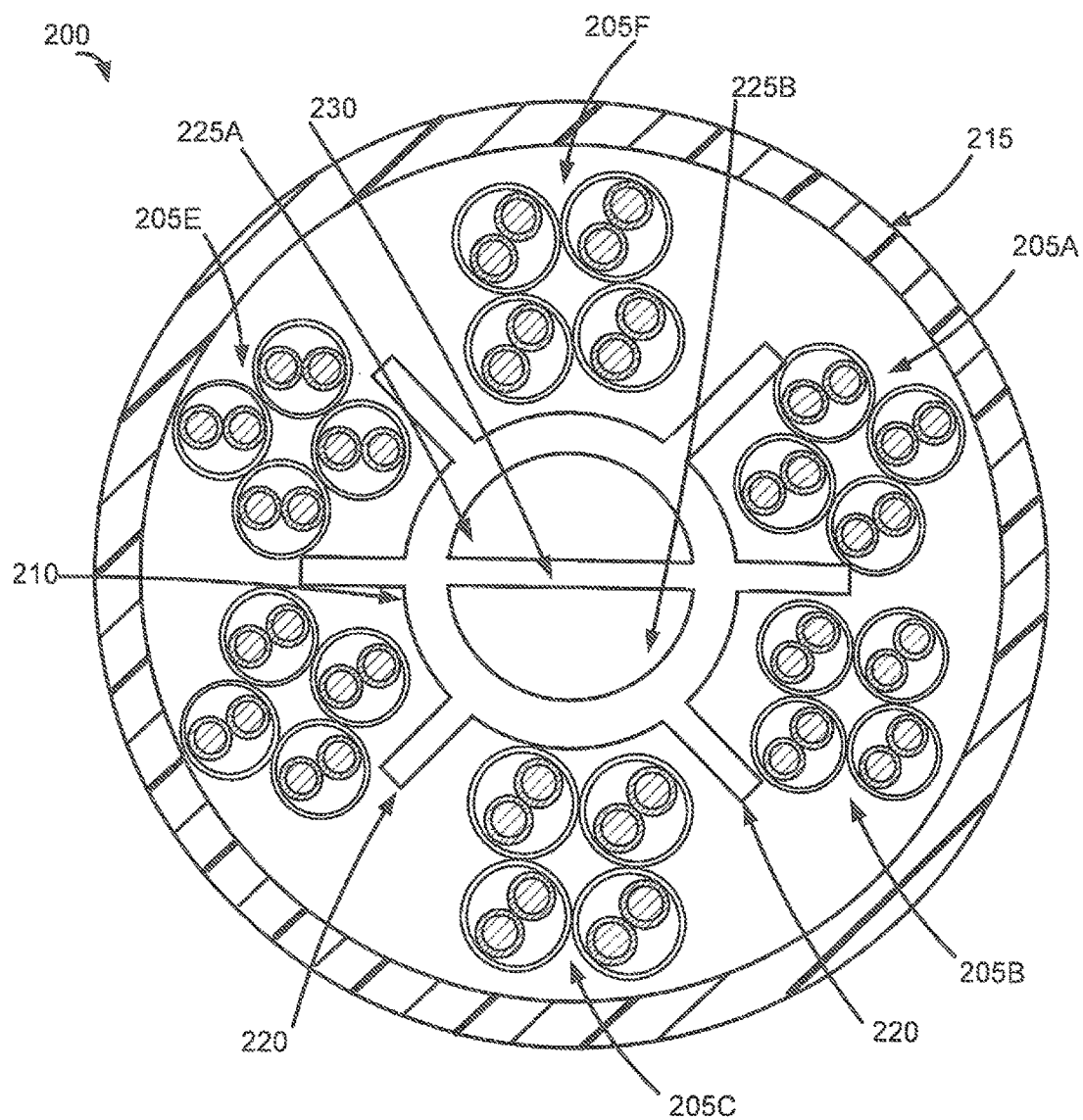

With continued reference to the twisted pair component 105, one or more shield layers may be formed around the twisted pairs 120A-D. For example, as shown in FIG. 1, an overall shield 125 may be formed around the collective plurality or group of twisted pairs 120A-D. As another example, as illustrated in FIG. 2, individual shields may be provided for each of the twisted pairs. In other embodiments, shield layers may be provided for any desired groupings of twisted pairs. In yet other embodiments, twisted pairs may be formed with a component that functions as both a dielectric separator positioned between the conductors of the twisted pair and as a shield element. As desired in various embodiments, multiple shield layers and/or types of shield layers may be provided, for example, individual shields and an overall shield. One or more shield layers may incorporate electrically conductive material, semi-conductive material, or dielectric shielding material in order to provide electrical shielding for one or more cable components.

Various embodiments of the shield layer 125 (or shield 125) illustrated in FIG. 1 are generally described herein; however, it will be appreciated that other shield layers may have similar constructions. In certain embodiments, a shield 125 may be formed from a single segment or portion that extends along a longitudinal length of the twisted pair component 105. In other embodiments, a shield 125 may be formed from a plurality of discrete segments or portions positioned adjacent to one another along a longitudinal length of the twisted pair component 105. In the event that discrete segments or portions are utilized, in certain embodiments, gaps or spaces may exist between adjacent segments or portions. In other embodiments, certain segments may overlap one another. For example, an overlap may be formed between segments positioned adjacent to one another along a longitudinal length of the cable.

As desired, a wide variety of suitable techniques and/or processes may be utilized to form a shield 125 (or a shield segment). In certain embodiments, a shield 125 may be a relatively continuous shield that includes shielding material that extends substantially along a longitudinal length of the shield element. For example, a relatively continuous metallic material, semi-conductive material, dielectric shielding material, a braided shielding material, or a foil shield may be utilized. In other embodiments, a shield 125 may be formed as a discontinuous shield having a plurality of isolated patches of shielding material. For example, a base material or dielectric material may be extruded, poltruded, or otherwise formed. Electrically conductive material or other shielding material may then be applied to (e.g., formed on, adhered to, etc.), injected into, embedded in, or otherwise combined with the base material. In certain embodiments, the base layer may have a substantially uniform composition and/or may be made of a wide range of materials. Further, the base layer may be foamed, may be a composite, and/or may include one or more strength members, fibers, threads, or yarns. As desired, flame retardant material, smoke suppressants, and/or other desired substances may be blended or incorporated into the base layer. Examples of suitable shielding arrangements that may be utilized in conjunction with the shield 125 and/or other shield elements are described in greater detail below.

In certain embodiments, the shield 125 (or individual shield segments) may be formed as a tape that includes both a dielectric layer and shielding material (e.g., copper, aluminum, silver, an alloy, etc.) formed on one or both sides of the dielectric layer. Examples of suitable materials that may be used to form a dielectric layer include, but are not limited to, various plastics, one or more polymeric materials, one or more polyolefins (e.g., polyethylene, polypropylene, etc.), one or more fluoropolymers (e.g., fluorinated ethylene propylene ("FEP"), polyester, polytetrafluoroethylene, polyimide, or some other polymer, combination of polymers, or dielectric material(s) that does not ordinarily conduct electricity. Shielding material may then be deposited on, adhered to, or otherwise formed on the dielectric layer. Additionally, in certain embodiments, shielding material may be sandwiched between two dielectric layers. In other embodiments, two or more layers of shielding material may be combined with any number of suitable dielectric layers to form the shield 125. Indeed, any number of suitable layers of material may be utilized to form a tape which may be used as the shield 125.

According to an aspect of the disclosure, the twisted pair component 105 may be an unjacketed component. In other words, no outer jacket layer is formed around the twisted pairs 120A-D and the one or more shield layers. In certain embodiments, at least one shield layer may contact the central member 110. For example, if an outer shield layer 125 is formed around the plurality of twisted pairs 120A-D, the outer shield layer 125 may be positioned adjacent to and/or may contact the central member 110. As another example, if individual shield layers are respectively formed around each of the twisted pairs 120A-D, one or more of the individual shield layers may be positioned adjacent to and/or contact the central member 110 at any given cross-sectional point along the longitudinal length of the cable 100. Additionally, in certain embodiments, a suitable binder may be helically wrapped around the plurality of twisted pairs 120A-D in order to hold the components of the twisted pair component 105 together. For example, if the twisted pairs 120A-D are individually shielded, a binder may be utilized. A binder may be formed from a wide variety of suitable materials, such as polymeric materials, water absorbent materials, flame retardant materials, etc.

Given the unjacketed nature of the twisted pair component 105, in certain embodiments, a shield 125 may be designed to be relatively rugged. In other words, the shield 125 may be less susceptible to tearing or other damage than conventional shield layers incorporated into jacketed communication cables. A wide variety of suitable design elements may be utilized in order to enhance the ruggedness of the shield 125. In certain embodiments, one or more relatively rugged materials may be utilized to form one or more components of the shield 125. For example, a polymeric material may be utilized as a dielectric layer in a shield 125 in order to attain a desired tensile strength. In other embodiments, a thickness of one or more components of the shield 125, such as a dielectric layer, may be selected in order to obtain a desired tensile strength. In certain example embodiments, a shield 125 may be constructed such that it has a load at yield of at least approximately 60N.

As a result of being unjacketed, the twisted pair component 105 may be formed with a smaller diameter than conventional twisted pair cables. Conventional twisted pair cable jackets have a thickness between approximately 15 mils (381 μm) and approximately 23 mils (584 μm). Even if one or more shield layers are thickened in order to improve their tensile strength relative to conventional shield layers, an overall diameter of the twisted pair component 105 may be reduced relative to conventional cables. Additionally, when a plurality of twisted pair components 105A-F are stranded around a central member 110, an overall diameter of the cable 100 may be reduced. In certain embodiments, the twisted pair component 105 may have an outer diameter that is less than or equal to approximately 7.5 mm.

In certain embodiments, a suitable separator 130 or filler may be incorporated into the twisted pair component 105. The separator 110 or filler may be configured to orient and or position one or more of the twisted pairs 120A-D. The orientation of the twisted pairs 120A-D relative to one another may provide beneficial signal performance. As desired in various embodiments, the separator 130 may be formed in accordance with a wide variety of suitable dimensions, shapes, or designs. The separator 130 illustrated in FIG. 1 has an approximately cross-shaped cross-section. As other examples, a rod-shaped or circular separator, a flat separator, an X-shaped or cross-shaped separator, a T-shaped separator, a Y-shaped separator, a J-shaped separator, an L-shaped separator, a diamond-shaped separator, a separator having any number of spokes extending from a central point, a separator having walls or channels with varying thicknesses, a separator having T-shaped members extending from a central point or center member, a separator including any number of suitable fins, and/or a wide variety of other shapes may be utilized.

Any number of suitable materials and/or combinations of materials may be utilized to form the separator 130. For example, any of the materials discussed herein as being suitable for forming either the shield layer 125 or the central member 110 may also be suitable for forming the separator 130. Additionally, a wide variety of suitable methods or techniques may be utilized to form the separator 130. In certain embodiments, material may be extruded through one or more dies and/or via any number of other suitable extrusion techniques in order to obtain a desired cross-sectional shape. In other embodiments, material may be cast or molded into a desired shape to form the separator 130. In yet other embodiments, a tape may be formed into a desired shape utilizing a wide variety of folding and/or shaping techniques. For example, a relatively flat tape may be formed into an X-shape or cross-shape as a result of being passed through one or more dies. Additionally, many of the formation techniques and/or example constructions described below for the central member 110 may be equally applicable to the separator 130.

As desired in various embodiments, the separator 130 may be formed to be relatively continuous along a longitudinal length of the cable 100 and/or the twisted pair component 105. In other embodiments, the separator 130 may be formed from a plurality of severed or discrete components that are arranged end-to-end along a longitudinal length. Additionally, in certain embodiments, the separator 130 may include any number of longitudinal channels, secondary channels, and/or heat sinks that provide a cooling function for the twisted pairs 120A-D incorporated into the twisted pair component 105. As desired, the separator 130 may also include shielding material, such as shielding material formed on one or more surfaces of the separator 130, shielding material embedded in a separator body, and/or shielding material (e.g., semi-conductive material, dielectric shielding material, etc.) utilized to form the separator 130 or one or more components of the separator 130. Many of these features are discussed in greater detail below with reference to the central member 110, and the discussion may be equally applicable to the separator 130. Additionally, various constructions and/or aspects of twisted pair separators are described in U.S. patent application Ser. No. 15/098,626, filed Apr. 14, 2016 and entitled "Communication Cables Incorporating Twisted Pair Separators with Cooling Channels"; and U.S. patent application Ser. No. 15/098,635, filed Apr. 14, 2016 and entitled "Communication Cables Incorporating Twisted Pair Separators." Both of these applications have been incorporated by reference herein in their entirety, and it will be understood that any of the described separators may be incorporated into the twisted pair component 105.

With continued reference to FIG. 1, the central member 110 may be positioned between the plurality of twisted pair components 105A-F. The central member 110 may include one or more longitudinally extending channels or longitudinal channels that facilitate convective heat transfer within the cable 100. In this regard, the central member 110 may assist in providing cooling for the twisted pair components 105A-F and/or the twisted pairs contained therein. As shown in FIG. 1, in certain embodiments, a single longitudinal channel 135 may be incorporated into the central member 110; however, as explained in greater detail below, other central member constructions may include a plurality of longitudinal channels.

Figure 3:
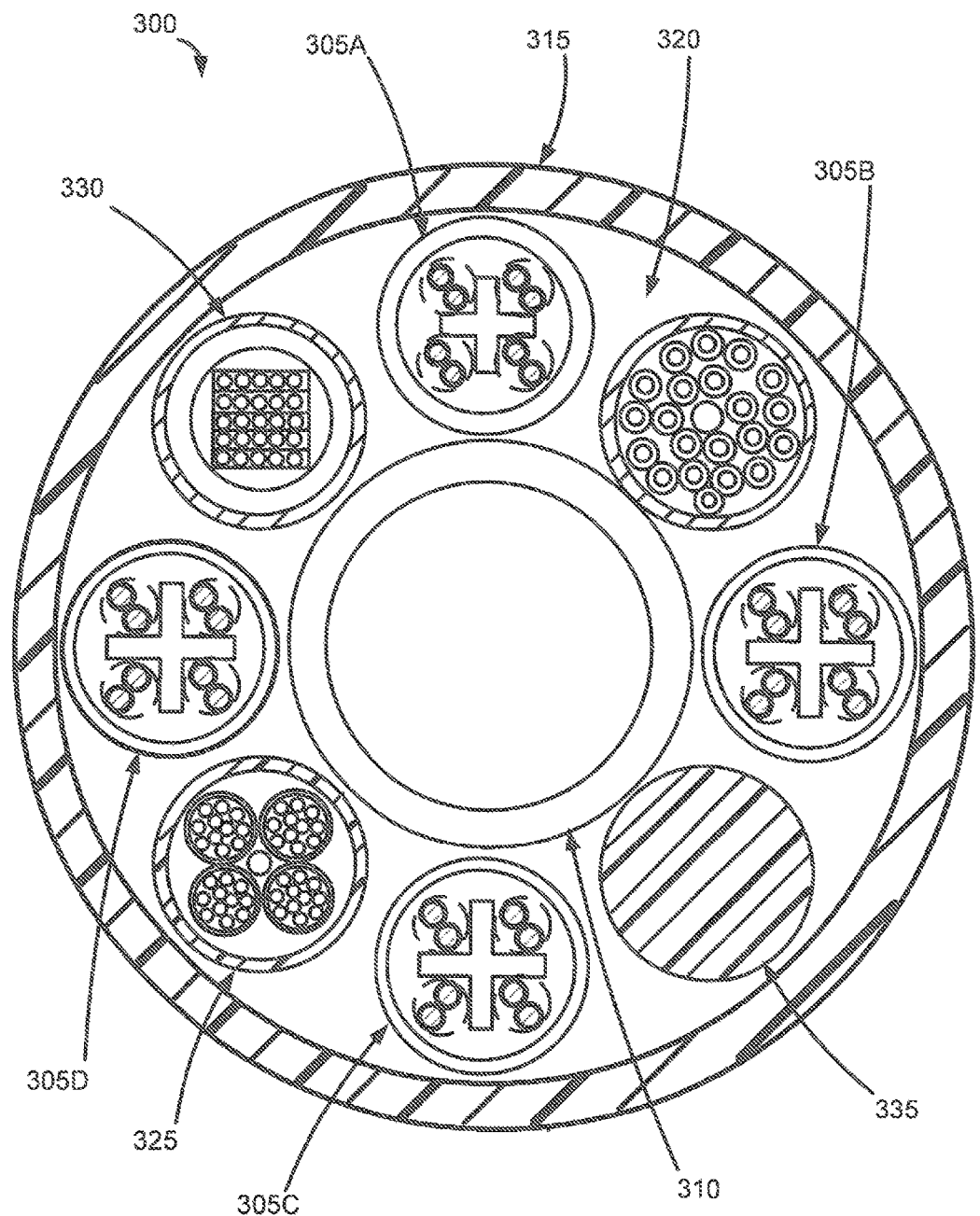

As desired in various embodiments, the central member 110 may be formed in accordance with a wide variety of suitable dimensions, shapes, or designs. The central member 110 illustrated in FIG. 1 has an approximately circular or rod-shaped cross-section. In other embodiments, a central member 110 may be formed with other suitable cross-sectional shapes including, but not limited to, an elliptical shape, a diamond shape, a hexagonal shape, an octagonal shape, a shape with spokes extending from a central portion, a cross-sectional shape that includes any number of suitable fins, etc. In certain embodiments, the central member 110 may include a central or body portion that is positioned between the twisted pair components 105A-F and one or more extensions, prongs, fins, or spokes may extend from the central portion. For example, prongs may extend from an approximately circular central portion. As desired, any number of prongs or extensions may extend from the central portion. Additionally, each prong or extension may extend between two of the twisted pair components 105A-F or other suitable components positioned adjacent to the central member 110. Further, as discussed in greater detail below, prongs may be formed with a wide variety of suitable materials, dimensions, constructions, and/or arrangements. A few example central members having different cross-sections are described in greater detail below with reference to FIGS. 6A-6H Additionally, the central member 110 (or at least a central or body portion) may be formed with a wide variety of suitable diameters, cross-sectional areas, and/or other dimensions. For example, a central member 110 having a circular cross-section may have a diameter between approximately 1.8 mm and approximately 7.5 mm. As another example, a central member 110 may have a cross-sectional area between approximately 2.5 $mm^2$ and approximately 44 $mm^2$. In certain embodiments, a central member 110 may be sized such that it has a diameter and/or cross-sectional area that is approximately equal to that of a twisted pair component 105 or other components stranded around the central member 110. In the event that the central member 110 and the stranded components have approximately equal sizes, a six around one configuration may be incorporated into the cable 100. In other words, six components may be tightly stranded around the central member 110. In other embodiments, the central member 110 may be sized such that it is larger or smaller than the components stranded around the central member 110. With a larger central member 110, as illustrated in FIG. 3, more than six components may be stranded around the central member 110. Indeed, the central member 110 may be formed with a wide variety of suitable dimensions in order to achieve a wide variety of desired overall cable designs and % or constructions.

A wide variety of suitable methods or techniques may be utilized as desired in order to form a central member 110. In certain embodiments, material may be extruded through one or more dies and/or via any number of other suitable extrusion techniques in order to obtain a desired cross-sectional shape. In other embodiments, material may be cast or molded into a desired shape to form the central member 110. Additionally, in certain embodiments, a central member 110 may be formed in a single pass (e.g., a single extrusion step). In other embodiments, a central member 110 may be formed via multi-step process. For example, a central member 110 may be formed with a plurality of layers. As another example, various components of the central member 110 (e.g., a central portion, fins or extensions, etc.) may be formed separately and then combined together. As desired, different manufacturing techniques may be utilized to form various components. For example, a central portion of the central member 110 may be extruded or molded, and then a tape may be folded around the central portion in order to form extensions or prongs.

At least one longitudinal channel 135 may extend along a longitudinal length of the central member 110, for example, from a first end of the central member 110 to a distal end of the central member 110. Additionally, in certain embodiments, a longitudinal channel 135 may extend through a body portion of the central member 110. In other words, the longitudinal channel 135 may define a cavity through the central member 110. Accordingly, the central member 110 may have both one or more inner surfaces that define respective cavities of longitudinal channels and an outer surface that defines an outer periphery of the central member 110. The longitudinal channel 135 may facilitate convective heat transfer along a longitudinal length of the central member 110 and/or cable 100. For example, as heat is generated in the cable 100 (e.g., heat in the twisted pair components 105A-F, heat developed at a portion of the cable 100 situated near electronic equipment, etc.), the longitudinal channel 135 may facilitate transfer of the heat to other portions of the cable 100. In other words, the longitudinal channel 135 may promote temperature balancing within the cable 100, thereby cooling the relatively hotter portions of the cable 100. As a result of this convective heat transfer, the electrical performance of the cable 100 and/or electronic equipment associated with the cable 100 may be improved or enhanced. In certain embodiments, such as embodiments in which the cable 100 or certain twisted pair components 105A-F are used for power over Ethernet applications, the convective heat transfer may facilitate increased power transmission rates.

The central member 110 illustrated in FIG. 1 has a single longitudinal channel 135. In other embodiments, a central member 110 may be formed with a plurality of longitudinal channels. Any suitable number of longitudinal channels may be incorporated into a central member 110 as desired. In the event that a plurality of longitudinal channels are utilized, in certain embodiments, each of the longitudinal channels may have similar dimensions (e.g., diameters, cross-sectional shapes, etc.). In other embodiments, at least two longitudinal channels may have different dimensions. Additionally, as desired, any number of internal ribs, dividers, spokes, or other suitable portions may separate the longitudinal channels from one another and provide internal support for the central member 110.

A wide variety of suitable methods or techniques may be utilized to form a longitudinal channel 135 as desired. In certain embodiments, the central member 110 may be extruded in a manner that facilitates the formation of one or more longitudinal channels. For example, an extrusion die utilized to form the central member 110 may also facilitate the formation of one or more longitudinal channels. A longitudinal channel 135 may be formed with a wide variety of suitable dimensions. As shown, the longitudinal channel 135 has an approximately circular cross-sectional shape. In other embodiments, a longitudinal channel may have an elliptical, square, rectangular, hexagonal, octagonal, or any other suitable cross-sectional shape. Additionally, the longitudinal channel 135 may have any suitable cross-sectional diameter and/or other dimensions (e.g., width, area, etc.) that define the size of the channel. In certain embodiments, the longitudinal channel 135 may have a diameter between approximately 1.0 mm and approximately 5.5 mm. For example, the longitudinal channel 135 may have a diameter of approximately 1.0 mm, 1.5 mm, 2.0 mm, 2.5 mm, 3.0 mm, 3.25 mm, 3.5 mm, 4.0 mm, 4.5 mm, 5.0 mm, 5.5 mm, a diameter incorporated in a range between any two of the above values, or a diameter incorporated in a range bounded on a minimum or maximum end by one of the above values. In other embodiments, the longitudinal channel 135 may have a width and/or length dimension between approximately 1.5 mm and approximately 5.5 mm. As other examples, a longitudinal channel 135 may have a width/length dimension of approximately 1.0 mm, 1.5 mm, 2.0 mm, 2.5 mm, 3.0 mm, 3.25 mm, 3.5 mm, 4.0 mm, 4.5 mm, 5.0 mm, 5.5 mm, a value incorporated in a range between any two of the above values, or a value incorporated in a range bounded on a minimum or maximum end by one of the above values. In yet other embodiments, the longitudinal channel 135 may have a cross-sectional area between approximately 0.8 $mm^2$ and approximately 24 $mm^2$. For example, the longitudinal channel 135 may have a cross-sectional area or approximately 0.8 $mm^2$, 1.0 $mm^2$, 1.5 $mm^2$, 2 $mm^2$, 3 $mm^2$, 4 $mm^2$, 5 $mm^2$, 6 $mm^2$, 7 $mm^2$, 8 $mm^2$, 9 $mm^2$, 10 $mm^2$, 11 $mm^2$, 12 $mm^2$, 13 $mm^2$, 14 mm, 15 $mm^2$, 16 $mm^2$, 17 $mm^2$, 18 $mm^2$, 19 $mm^2$, 20 $mm^2$, 21 $mm^2$, 22 $mm^2$, 23 $mm^2$, 24 $mm^2$, 25 $mm^2$, a value incorporated in a range between any two of the above values, or a value incorporated in a range bounded on a minimum or maximum end by one of the above values. Additionally, in certain embodiments, the longitudinal channel 135 (or the combination of a plurality of longitudinal channels) may be sized in order to achieve a desired convective heat transfer rate along the cable 100.

In certain embodiments, the longitudinal channel 135 may be filled with a suitable gas, such as air, nitrogen, helium, or a suitable mixture of gases. As desired, a gas or mixture of gases having a desired thermal conductivity, such as a thermal conductivity estimated using the Chapman-Enskog model, may be selected. In other embodiments, the longitudinal channel 135 may be filled with a suitable refrigerant or cooling liquid, such as water, glycols, one or more dielectric fluids, etc. Additionally, in certain embodiments, a substance (e.g., air, etc.) may be permitted to freely migrate within the channel. In other embodiments, the cable 100 may be connected to one or more suitable circulation systems that facilitate flow of a cooling substance through the cable 100. For example, one or more fans may be positioned at an end of the cable 100 to facilitate gas flow through the longitudinal channel 135. As another example, one or more suitable pumping systems, compressors, refrigeration systems, etc. may facilitate the flow of cooling gas and/or liquid through the longitudinal channel 135. In the event that a plurality of longitudinal channels are incorporated into a central member, in certain embodiments, one or more fluid diverting end caps and/or other suitable components may be utilized to facilitate the recirculation of fluids (e.g., gases, liquids, etc.) through two or more longitudinal channels.

In certain embodiments, the central member 110 may additionally include one or more second channels that extend from a longitudinal channel 135 through the central member 110. For example, one or more second channels may extend from the cavity defined by the longitudinal channel 135 through a body of the central member 110 to an outer surface of the central member 110. These second channels may further facilitate convective heat transfer via the central member 110. For example, one or more second channels may facilitate transfer of heat from other areas of the cable core (e.g., areas in which one or more twisted pairs components 105A-F are positioned) to the longitudinal channel 135, and the longitudinal channel 135 may then assist in normalizing the temperature of the cable 100 along its longitudinal length.

A second channel may be formed with a wide variety of suitable dimensions. As desired in various embodiments, a second channel may have an approximately circular, elliptical, square, rectangular, hexagonal, octagonal, or any other suitable cross-sectional shape. Additionally, the second channel may have any suitable cross-sectional diameter and/or other dimensions (e.g., width, area, etc.) that define the size of the channel. In certain embodiments, a second channel may have a diameter, cross-sectional area, or other dimension similar to those described above for the longitudinal channel 135. For example, the second channel may have a cross-sectional area of approximately 0.5 $mm^2$, 0.8 $mm^2$, 1.0 $mm^2$, 1.5 $mm^2$, 2 $mm^2$. 3 mm, 4 $mm^2$, 5 $mm^2$, 6 $mm^2$, 7 $mm^2$, 8 $mm^2$, 9 $mm^2$, 10 $mm^2$, a value incorporated in a range between any two of the above values, or a value incorporated in a range bounded on a minimum or maximum end by one of the above values. Additionally, in certain embodiments, the second channel may be sized in order to achieve a desired convective heat transfer rate between the cable core and the longitudinal channel 135.

As desired in various embodiments, any number of second channels may be incorporated into the central member 110. Additionally, a wide variety of configurations and/or arrangements of second channels may be utilized. In certain embodiments, one or more second channels may be positioned at a plurality of respective points along the longitudinal length of the central member 110. For example, second channels may be spaced along the central member 110 in a pattern or with a repeating step. A wide variety of suitable spacings or distances may be present between second channels, such as spacings of approximately 0.05 meters, 0.1 meters, 0.25 meters, 0.5 meters, 1.0 meters, 1.5 meters, 2.0 meters, 2.5 meters, 3.0 meters, 4.0 meters, 5.0 meters, a spacing included in a range between any two of the above values, and/or a spacing that is included in a range bounded on either a minimum or maximum end by one of the above values. In other embodiments, second channels may be positioned along the central member 110 in accordance with a random or pseudo-random pattern.

Additionally, in certain embodiments, a single second channel may be formed at each respective cross-sectional location along a longitudinal length of the central member 110. In other embodiments, a plurality of second channels may be formed at one or more locations at which second channels are positioned. For example, a first one of the second channels may open at a first point along an outer periphery of the central member 110 (e.g., a location proximate to a first twisted pair component) while a second one of the second channels may open at a second point along an outer periphery of the central member 110 (e.g., a location proximate to a second twisted pair component). Any number of second channels may be formed at a given location. For example, a second channel may be formed that corresponds to each of the twisted pairs components 105A-F. As another example, a second channel may be formed that corresponds to each prong or fin extending from the central member 110.

In other embodiments, one or more second channels having a first orientation may be formed at a first longitudinal position along the central member 110 while one or more additional second channels having a second orientation may be formed at a second longitudinal position along the central member 110. For example, at a first position, a second channel may be formed that opens at a location proximate to a first twisted pair component and, at a second position, an additional second channel may be formed that opens at a location proximate to a second twisted pair component. As another example, second channels may be formed with different directions through the central member 110, and the direction of the formation may be altered such that a first one of the second channels opens proximate to a first and fourth twisted pair component 105A, 105D; a second one of the second channels opens proximate to a second and fifth twisted pair component 105B, 105E; and third one of the second channels opens proximate to a third and sixth twisted pair component 105C, 105F. A wide variety of other suitable configurations may be utilized as desired, and those discussed herein are provided by way of example only.

Further, a second channel may extend through the central member 110 at any desired angle. In certain embodiments, a second channel may be formed such that it is perpendicular to the longitudinal channel 135. In other embodiments, a second channel may be formed such that it opens into the longitudinal channel 135 at an acute angle. A wide variety of suitable acute angles may be utilized as desired, such as an approximately 25°, 30°, 35°, 45°, 50°, 55°, 60°, 65°, 70°, 75°, 80°, 85°, any angle included in a range between any two of the above values, and/or an angle that is included in a range bounded on either a minimum or maximum end by one of the above values. In certain embodiments, each of the second channels may be formed at approximately equal angles with respect to the longitudinal channel 135. In other embodiments, at least two of the second channels may be formed at varying or different angles with respect to the longitudinal channel 135.

A wide variety of suitable methods or techniques may be utilized to form one or more second channels as desired in various embodiments. In certain embodiments, after the central member 110 is formed (e.g., extruded, etc.), one or more suitable punching, cutting, and/or drilling devices may be utilized to form second channels in the central member 110. Each device may form respective second channels at a plurality of locations along the central member 110 as the central member 110 is fed past and/or through the device. In certain embodiments, the central member 110 may be extruded or otherwise formed, and second channels may then be formed in a relatively continuous or on-line process. In other embodiments, formation of the central member 110 and the second channels may occur in an off-line manner.

As desired in various embodiments, electromagnetic shielding material may be incorporated into the central member 110. A wide variety of different types of materials may be utilized to provide shielding, such as electrically conductive material, semi-conductive material, and/or dielectric shielding material. A few examples of suitable materials are described in greater detail below. Additionally, as desired in various embodiments, shielding material may be incorporated into the central member 110 at a wide variety of locations. In certain embodiments, shielding material may be formed on one or more surfaces of the central member 110. For example, shielding material may be formed on an internal surface of the central member 110 body within the longitudinal channel 135. As another example, shielding material may be formed on an external surface of the central member 110, such as on an external surface of a central member body and/or on one or more fins, prongs, or extensions. As yet another example, shielding material may be formed on a plurality of surfaces of the central member 110, such as on an internal surface and on an external surface. In other embodiments, shielding material may be embedded within the body of the central member 110. For example, particles of shielding material may be blended into or otherwise incorporated into the body of the central member 110. As another example, a layer of shielding material may be positioned between layers of a central member body, such as two dielectric layers. In yet other embodiments, a central member 110 may be extruded, molded, or otherwise formed from a one or more suitable shielding materials. For example, a central member 110 may be formed from one or more conductive, semi-conductive, and/or dielectric shielding materials. In yet other embodiments, a central member 110 may include a plurality of different types of shielding materials. For example, a central member 110 may be extruded from a dielectric shielding material and one or more layers of electrically conductive material may be formed on the central member 110. A wide variety of other suitable central member constructions that incorporate shielding material may also be utilized.

In certain embodiments, the central member 110 may include shielding material that is continuous along the longitudinal length of the central member 110. For example, a relatively continuous layer of shielding material may be formed on a central member surface. As another example, the central member 110 may be formed from one or more shielding materials. In other embodiments, the central member 110 may include discontinuous shielding material. With discontinuous shielding material, shielding material may be spaced throughout the central member 110 or within a layer of the central member 110 (e.g., a layer formed on a surface) and gaps or spaces may be present between adjacent shielding material components. In certain embodiments, one or more discontinuous patches of shielding material may be formed. For example, discontinuous patches of shielding material may be formed on one or more central member surfaces. As described in greater detail below, a wide variety of suitable configurations and/or patterns of shielding material may be formed as desired in various embodiments.

As set forth above, in certain embodiments, one or more prongs, extensions, fins, or projections (hereinafter referred to as prongs) may be incorporated into a central member 110. For example, one or more prongs may extend from a central portion of the central member 110. A few examples of central members that include prongs are described in greater detail below with reference to FIGS. 2, 5F, 5G, 6E, and 6F. In certain embodiments, a prong may extend between two components formed around the central member 110, such as two of the twisted pair components 105A-F. As desired, any number of prongs may extend from the central member 110. For example, a respective prong may extend between each pair of adjacent components formed around the central member 110.

Additionally, each prong may have a wide variety of suitable dimensions and/or constructions. For example, a prong may have a wide variety of suitable lengths and/or thicknesses at any given cross-sectional point along a longitudinal length of the central member 110. In certain embodiments, the length of the prong may be the distance that the prong extends from a body of the central member 110 towards the jacket 115. Examples of suitable lengths include lengths of approximately 0.25, 0.5, 0.75, 1.0, 1.25, and 1.5 times the diameter of a twisted pair component 105, lengths included in a range between any two of the above values, and lengths included in a range bounded on either a minimum or maximum end by one of the above values. In certain embodiments, the thickness of a prong may correspond to a dimension that defines a minimum separation between components (e.g., two twisted pair components, etc.) positioned on either side of the prong. Examples of suitable thicknesses include, for example, thickness that are approximately 0.25, 0.3, 0.35, 0.4, 0.45, 0.5 times that of the length of a prong, thicknesses included in a range between any two of the above values, and thicknesses included in a range bounded on either a minimum or maximum end by one of the above values. Further, although the example prongs illustrated in FIGS. 2, 5F, 5G, 6E, and 6F are relative strait or flat projections, in other embodiments, prongs may have other cross-sectional shapes. For example, a prong may have an approximately A-shaped, V-shaped, T-shaped, L-shaped, J-shaped, or other suitable cross-sectional shape.

In certain embodiments, a prong may be formed from the same material or groups of materials as a body portion or central component of the central member 110. For example, a central member 110 may be molded or extruded to include both a body portion and one or more prongs. In other embodiments, a prong may be formed from a different material or group of materials than a body portion of the central member 110. For example, a body portion of the central member 110 may be formed from one or more polymeric materials, and a prong may be formed from an electrically conductive material or from a dielectric material that includes electrically conductive patches. In this regard, the prong may provide shielding between two twisted pair components and/or may function as a heat sink that draws heat away from the twisted pair components and transfers it to the central member 110.

Additionally, in certain embodiments, a prong may be continuous along a longitudinal length of the central member 110. In other words, the prong may extend approximately from one end of the central member 110 to a distal end of the central member 110. In other embodiments, a prong may selectively extend from the central member 110 at various locations along its longitudinal length. For example, one meter sections of prongs may extend from the central member 110 with gaps or spaces formed between adjacent sections. Each prong section may have any suitable longitudinal length, and the gaps or spaces between sections may have any suitable longitudinal lengths. In certain embodiments, the various prong sections may be formed in accordance with a repeating pattern or definite step. In other embodiments, prong sections may be formed with random or pseudo-random longitudinal lengths. In yet other embodiments, different longitudinally-extending sections of a prong, regardless of whether the prong is continuous or whether it includes gaps between a plurality of sections, may be formed from different materials and/or groups of materials. For example, a first section may be formed from an electrically conductive material while a second section is formed from a dielectric material. As another example, a first section may be formed from a dielectric material while a second section is formed from a flame retardant material. Indeed, a wide variety of suitable combinations of materials may be utilized.

In certain embodiments, a prong may be formed as a relatively solid structure. In other embodiments, one or more longitudinally extending channels may be incorporated into a prong. These longitudinal channels may be similar to the longitudinal channel 135 described above for the central member. As desired, a prong may also include any number of second channels. Additionally, in certain embodiments, channels incorporated into a prong may be connected to or in fluid communication with at least one longitudinal channel formed through the body portion of the central member 110. A prong may also incorporate a wide variety of suitable shielding material as desired in various embodiments.

As desired in various embodiments, one or more heat sinks may also be incorporated into the central member 110. A heat sink may operate to absorb and/or transfer thermal energy or heat away from the twisted pair components 105A-F and/or electronic equipment associated with the cable 100. In certain embodiments, a heat sink may transfer heat to the longitudinal channel 135 such that the heat may be removed and/or dissipated. A wide variety of different types of heat sinks may be incorporated into the central member 110. Examples of suitable heat sinks include heat sinks formed from aluminum, aluminum alloys, copper, copper alloys, other metallic materials, diamond, one or more composite materials, etc. Additionally, a heat sink may be positioned at a wide variety of locations within a central member 110. In certain embodiments, a heat sink may be positioned within a longitudinal channel 135 or within a second channel. In other embodiments, a heat sink may extend partially or completely through the central member body, for example, from the longitudinal channel 135 through the central member body to an external surface. In yet other embodiments, the prongs or extensions of a central member may be formed or partially formed from or as heat sinks. As another example, heat sinks may be utilized to form fins in addition to the prongs or extensions of the central member 110, such as fins extending from an external surface of the central member 110, fins extending into the longitudinal channel 135, and/or fins extending through the central member body.

A heat sink may be formed with a wide variety of suitable dimensions as desired in various embodiments. For example, a heat sink may have a wide variety of suitable shapes (e.g., rectangular, trapezoidal, etc.) and/or sizes. Additionally, a plurality of heat sinks may be arranged into any suitable configuration, such as a pin fin configuration, a straight fin configuration, or a flared fin configuration.

Further, as desired in various embodiments, heat sinks may be positioned at a wide variety of suitable locations along a longitudinal length of the central member 110. In certain embodiments, respective heat sinks or sets of heat sinks may be positioned at spaced locations along a longitudinal length of the central member 110. A wide variety of suitable longitudinal spaces may be present between heat sinks, such as spaces of approximately 0.1 meters, 0.25 meters, 0.5 meters, 1.0 meters, 2.0 meters, 3.0 meters, 5.0 meters, a spacing included in a range between any two of the above values, or a spacing included in a range bounded on either a minimum or maximum end by one of the above values. In other embodiments, a heat sink may be relatively continuous along a longitudinal length of the central member 110. For example, a tin may extend along a length of the central member 110.

In certain embodiments, a central member 110 may be formed from a single segment or portion. In other words, the central member 110 may be formed as a relatively continuous central member along a longitudinal length of the cable 100. In other embodiments, a central member 110 may be formed from a plurality of discrete or severed segments or portions. For example, discrete segments or portions may be positioned adjacent to one another along a longitudinal length of the central member 110. In certain embodiments, gaps or spaces may be present between various segments or portions of the central member 110. In other embodiments, at least a portion of the segments may be arranged in an overlapping configuration.

The central member 110 may have a body formed from a wide variety of suitable materials as desired in various embodiments. For example, the dielectric base of the central member 110 and/or various central member segments can include paper, metals, alloys, various plastics, one or more polymeric materials, one or more polyolefins (e.g., polyethylene, polypropylene, etc.), one or more fluoropolymers (e.g., fluorinated ethylene propylene ("FEP"), melt processable fluoropolymers. MFA, PFA, ethylene tetrafluoroethylene ("ETFE"), ethylene chlorotrifluoroethylene ("ECTFE"), etc.), one or more polyesters, polyvinyl chloride ("PVC"), one or more flame retardant olefins (e.g., flame retardant polyethylene ("FRPE"), flame retardant polypropylene ("FRPP"), a low smoke zero halogen ("LSZH") material, etc.), polyurethane, neoprene, cholorosulphonated polyethylene, flame retardant PVC, low temperature oil resistant PVC, flame retardant polyurethane, flexible PVC, one or more dielectric shielding materials (e.g., barium ferrite, etc.) or any other suitable material or combination of materials. In certain embodiments, the central member 110 may have a relatively flexible body. As desired, the central member 110 may be filled, unfilled, foamed, un-foamed, homogeneous, or inhomogeneous and may or may not include additives (e.g., flame retardant and/or smoke suppressant materials).

As desired, a wide variety of suitable techniques and/or processes may be utilized to form the central member 110 or various segments or components of the central member 110. For example, a base material or dielectric material may be extruded, poltruded, or otherwise formed. In certain embodiments, electrically conductive material or other shielding material may be applied to the base material, inserted into the base material, or embedded in the base material. In other embodiments, dielectric material may be formed around shielding material. As desired, the base layer may have a substantially uniform composition, may be made of a wide range of materials, and/or may be fabricated in a single manufacturing pass. Further, the base layer may be foamed, may be a composite, and may include one or more strength members, fibers, threads, or yarns. Additionally, the base layer may be hollow and/or include any number of longitudinal channels 135 as described above. In other embodiments, the central member 110 or certain components of the central member 110 may be formed from a tape that includes one or more dielectric layers (e.g., plastic, polyester, polyethylene, polypropylene, fluorinated ethylene propylene, polytetrafluoroethylene, polyimide, or some other polymer or dielectric material that does not ordinarily conduct electricity etc.) and, if desired, one or more electrically conductive layers (e.g., copper, aluminum, an alloy, etc.) or shielding layers. A tape utilized in a central member may be formed in a similar manner as the tape shield layer described below.

For a segmented central member formed from a plurality of discrete segments, the various portions or segments of the central member 110 may include a wide variety of different lengths and/or sizes. For example, a portion of the central member 110 may be approximately 0.5 m, 1.0 m, 1.5 m, 2.0 m, 2.5 m, 3.0 m, 3.5 m, a length included in a range between two of the above values, or a length included in a range bounded on either a minimum or maximum end by one of the above values. In certain embodiments, portions having a common length may be incorporated into the cable 100. In other embodiments, portions of the central member 110 may have varying lengths. These varying lengths may follow an established pattern or, alternatively, may be incorporated into the cable 100 at random. Additionally, in certain embodiments, each segment or portion of the central member 110 may be formed from similar materials. In other embodiments, a central member 110 may make use of alternating materials in adjacent portions (whether or not a gap is formed between adjacent portions). For example, a first portion or segment of the central member 110 may be formed from a first set of one or more materials, and a second portion or segment of the central member 110 may be formed from a second set of one or more materials. As one example, a relatively flexible material may be utilized in every other portion of a central member 110. As another example, relatively expensive flame retardant material and/or shielding material may be selectively incorporated into desired portions of a central member 110.

As set forth above, the central member 110, one or more shield layers (e.g. shield layer 125, etc.), a separator (e.g., separator 130), and/or any other suitable component may provide shielding for the cable 100 and/or various cable components (e.g., one or more twisted pair components 105A-F). Any of the components that provide shielding may be generally referred to as a shield element. Additionally, as previously mentioned, shielding material may be incorporated into a shield element utilizing a wide variety of suitable techniques and/or configurations. For example, a shield element may be formed (e.g., extruded, molded, etc.) from a shielding material. As another example, shielding material may be embedded into a shield element. As yet another example, shielding material may be formed on a base layer or a dielectric layer. In certain embodiments, a separate base dielectric layer and shielding layer may be bonded, adhered, or otherwise joined (e.g., glued, etc.) together to form a shield element. In other embodiments, shielding material may be formed on a dielectric layer via any number of suitable techniques, such as the application of metallic ink or paint, liquid metal deposition, vapor deposition, welding, heat fusion, adherence of patches to the dielectric, or etching of patches from a metallic sheet. In certain embodiments, the patches of shielding material can be over-coated with a dielectric layer or electrically insulating film, such as a polyester coating.

In certain embodiments, a shield element may be a relatively continuous shield element that includes shielding material that extends substantially along a longitudinal length of the shield element. For example, a relatively continuous metallic material, a braided shielding material, or a foil shield may be utilized. In other embodiments, a shield element may be formed as a discontinuous shield element having a plurality of isolated patches of shielding material. For non-segmented or continuous shield elements, a plurality of patches of shielding material may be incorporated into the shield element, and gaps or spaces may be present between adjacent patches in a longitudinal direction. For segmented shield elements, in certain embodiments, each segment or section of the shield element may include either a single patch of shielding material. In other embodiments, a segment of a shield element may include a plurality of electrically conductive patches, and gaps or spaces may be present between adjacent patches. For example, a plurality of discontinuous patches may be formed on one or more surfaces with gaps between adjacent patches. A wide variety of different patch patterns may be formed as desired in various embodiments, and a patch pattern may include a period or definite step. In other embodiments, patches may be formed in a random or pseudo-random manner. Additionally, for discontinuous shields, individual patches may be separated from one another so that each patch is electrically isolated from the other patches. That is, the respective physical separations between the patches may impede the flow of electricity between adjacent patches. In certain embodiments, the physical separation of other patches may be formed by gaps or spaces, such as gaps of dielectric material or air gaps.

A wide variety of suitable materials and/or combination of materials may be utilized to form shielding layers and/or patches of shielding material. In certain embodiments, one or more electrically conductive materials may be utilized including, but not limited to, metallic material (e.g., silver, copper, nickel, steel, iron, annealed copper, gold, aluminum, etc.), metallic alloys, conductive composite materials, etc. Indeed, suitable electrically conductive materials may include any material having an electrical resistivity of less than approximately $1 \times 10^{-7}$ ohm meters at approximately 20° C. In certain embodiments, an electrically conductive material may have an electrical resistivity of less than approximately $3 \times 10^{-8}$ ohm meters at approximately 20° C. In other embodiments, one or more semi-conductive materials may be utilized including, but not limited to, silicon, germanium, other elemental semiconductors, compound semiconductors, materials embedded with conductive particles, etc. In yet other embodiments, one or more dielectric shielding materials may be utilized including, but not limited to, barium ferrite, etc.

The components of a shield element or various segments of a shield element may include a wide variety of suitable dimensions, for example, any suitable lengths in the longitudinal direction and/or any suitable thicknesses. A dielectric portion included in a shield element or segment, for example, the body portion of a central member, may have any suitable thickness. Additionally, each patch of shielding material may have any desired thickness, such as a thickness of about 0.5 mils (about 13 microns) or greater. In many applications, signal performance benefits from a thickness that is greater than about 2 mils, for example in a range of about 2.0 to about 2.5 mils, about 2.0 to about 2.25 mils, about 2.25 to about 2.5 mils, about 2.5 to about 3.0 mils, or about 2.0 to about 3.0 mils.

In certain embodiments, a patch of shielding material may cover substantially an entire area of a shield element or shield element segment. In other embodiments, a plurality of patches may be formed on a segment and/or a relatively continuous shield element. A wide variety of segment and/or patch lengths (e.g., lengths along a longitudinal direction of the cable 100) may be utilized. As desired, the dimensions of the segments and/or patches can be selected to provide electromagnetic shielding over a specific band of electromagnetic frequencies or above or below a designated frequency threshold. In certain embodiments, each segment and/or patch may have a length of about one meter to about one hundred meters, although lengths of less than one meter (e.g., lengths of about 1.5 to about 2 inches, etc.) may be utilized. For example, the segments and/or patches may have a length in a range of about one to ten meters. In various embodiments, the segments and/or patches can have a length of about 0.5, 0.75, 1.0, 1.5, 2.0, 2.5, 3.0, 3.5, 4.0, 4.5, or 5.0 meters or in a range between any two of these values;

In the event that a plurality of patches is formed on a relatively continuous shield element or a shield element segment, a wide variety of suitable gap distances or isolation gaps may be provided between adjacent patches. For example, the isolation spaces can have a length of about 0.5, 1.0, 1.5, 2.0, 2.5, 3.0, 3.5, or 4 millimeters or in a range between any two of these values. In one example embodiment, each patch may be at least two meters in length, and a relatively small isolation gap (e.g., 4 millimeters or less, about 1/16 of an inch, etc.) may be formed between adjacent patches. As explained in greater detail below with reference to FIG. 7F, in certain embodiments, a plurality of microcuts may be utilized to form a gap between two patches. Additionally, as desired, the patches may be formed as first patches (e.g., first patches on a first side of a dielectric material or body portion, on an outer surface), and second patches may be formed on an opposite side of the shield element (e.g., on an opposite side of a dielectric material or body portion, within a longitudinal channel, etc.). For example, second patches may be formed to correspond with the gaps or isolation spaces between the first patches. As desired, the patches may have a wide variety of different shapes and/or orientations. For example, the patches may have a rectangular, trapezoidal, or parallelogram shape. A few example shapes for patches are described in greater detail below with reference to FIGS. 7A-7G.

In certain embodiments, shield element segments and/or patches may be formed to be approximately perpendicular (e.g., square or rectangular segments and/or patches) to the longitudinal axis of twisted pairs incorporated into the cable 100 (e.g., pairs enclosed by a shield, pairs adjacent to a separator, etc.). In other embodiments, the segments and/or patches may have a spiral direction that is opposite the twist direction of one or more pairs. That is, if the twisted pair(s) are twisted in a clockwise direction, then the segments and/or patches may spiral in a counterclockwise direction. If the twisted pair(s) are twisted in a counterclockwise direction, then the conductive patches may spiral in a clockwise direction. Thus, twisted pair lay opposes the direction of the segment and/or patch spiral. The opposite directions may provide an enhanced level of shielding performance. In other embodiments, the segments and/or patches may have a spiral direction that is the same as the twist direction of one or more pairs.

According to an aspect of the disclosure, one or more techniques may be utilized to reduce and/or eliminate electrical perturbations between shielding patches and/or at the circumferential edges of a shield element. As desired, these techniques may be applied to shield layers (e.g., the external shield 125, etc.), separators (e.g., separator 130, etc.), a central member 110, and/or to other suitable shield elements. As one example technique, in certain embodiments, at least one patch included in a shield element may be electrically shorted to itself or electrically continuous along a circumferential direction of the shield element. As another example technique, a shield element may be formed with overlapping segments in order to effectively eliminate longitudinal spaces or gaps between adjacent patches formed on the shield element. Each of these techniques are described in greater detail below.

In certain embodiments, at least one patch included in a shield element may be electrically shorted or continuous along a circumferential direction. For example, when a shield 125 (or a plurality of shield segments) is wrapped around one or more twisted pairs 105A-D, a patch may contact itself at or near the edges of the shield 150. As another example, when a separator 130 is formed from a tape, a patch may contact itself at or near the edges of the tape. As yet another example, a patch may be formed on a central member 110 or separator 130 such that the patch extends around the circumference of the shield element and contacts itself. In any of these examples, the patch may be electrically shorted to itself, thereby creating a continuous patch in a circumferential direction or along a periphery of the shield element. When the shield element is formed to include a plurality of patches that are discontinuous in a longitudinal direction and one or more patches are electrically shorted in a circumferential direction, electrical perturbations caused by the shield element may be reduced relative to conventional cables. Therefore, the cable 100 may exhibit improved electrical performance, such as reduced return loss and/or reduced cross-talk loss.

In certain embodiments, at least one shield element may be formed to include overlapping segments. For example, a shield element may be formed to include a plurality of electrically conductive patches arranged in a discontinuous manner; however, in contrast to certain conventional shield elements, the shield element may not include spaces or gaps between certain patches along its longitudinal direction. The shield element may include a plurality of discrete overlapping segments or sections along a longitudinal length of the cable, and each segment may include at least one patch of shielding material. The combination of the segments may form a discontinuous shield element; however, the overlapping nature of the segments may eliminate gaps between certain patches along a longitudinal direction. Thus, the discontinuous shield element may exhibit improved electrical performance relative to conventional discontinuous shields.

The jacket 115 may enclose the internal components of the cable 100, seal the cable 100 from the environment, and provide strength and structural support. The jacket 115 may be formed from a wide variety of suitable materials and/or combinations of materials, such as one or more polymeric materials, one or more polyolefins (e.g., polyethylene, polypropylene, etc.), one or more fluoropolymers (e.g., fluorinated ethylene propylene ("FEP"), melt processable fluoropolymers, MFA, PFA, ethylene tetrafluoroethylene ("ETFE"), ethylene chlorotrifluoroethylene ("ECTFE"), etc.), one or more polyesters, polyvinyl chloride ("PVC"), one or more flame retardant olefins (e.g., flame retardant polyethylene ("FRPE"), flame retardant polypropylene ("FRPP"), a low smoke zero halogen ("LSZH") material, etc.), polyurethane, neoprene, cholorosulphonated polyethylene, flame retardant PVC, low temperature oil resistant PVC, flame retardant polyurethane, flexible PVC, or a combination of any of the above materials. The jacket 115 may be formed as a single layer or, alternatively, as multiple layers. In certain embodiments, the jacket 115 may be formed from one or more layers of foamed material. As desired, the jacket 115 can include flame retardant and/or smoke suppressant materials. Additionally, the jacket 115 may include a wide variety of suitable shapes and/or dimensions. For example, the jacket 115 may be formed to result in a round cable or a cable having an approximately circular cross-section; however, the jacket 115 and internal components may be formed to result in other desired shapes, such as an elliptical, oval, or rectangular shape. The jacket 115 may also have a wide variety of dimensions, such as any suitable or desirable outer diameter and/or any suitable or desirable wall thickness. In various embodiments, the jacket 115 can be characterized as an outer jacket, an outer sheath, a casing, a circumferential cover, or a shell.

An opening enclosed by the jacket 115 may be referred to as a cable core, and the central member 110 and twisted pair components 105A-F may be disposed within the cable core. Although a single cable core is illustrated in FIG. 1, a cable may be formed to include multiple cable cores. In certain embodiments, a cable core may be filled with a gas such as air (as illustrated) or alternatively a gel, solid, powder, moisture absorbing material, water-swellable substance, dry filling compound, or foam material, for example in interstitial spaces between the internal components. Other elements can be added to the cable core as desired, for example one or more optical fibers, additional electrical conductors, additional twisted pairs, water absorbing materials, and/or strength members, depending upon application goals.

As desired in various embodiments, a wide variety of other materials may be incorporated into the cable 100. For example, as set forth above, the cable 100 may include any number of conductors, twisted pairs, optical fibers, and/or other transmission media. For example, as illustrated in FIG. 3, a wide variety of optical fiber components, other transmission media, and/or spacers may be positioned around a central member. As another example, the cable 100 may include a suitable armor layer, such as a corrugated armor or dielectric armor layer. Additionally, as desired, a cable may include a wide variety of strength members, swellable materials (e.g., aramid yarns, blown swellable fibers, etc.), insulating materials, dielectric materials, flame retardants, flame suppressants or extinguishants, gels, and/or other materials. The cable 100 illustrated in FIG. 1 is provided by way of example only. Embodiments of the disclosure contemplate a wide variety of other cables and cable constructions. These other cables may include more or less components than the cable 100 illustrated in FIG. 1. Additionally, certain components may have different dimensions and/or materials than the components illustrated in FIG. 1.

FIG. 2 is a cross-sectional view of another example cable 200 that may include a central member that provides for convective heat transfer, according to an illustrative embodiment of the disclosure. The cable 200 of FIG. 2 may include components that are similar to the cable 100 illustrated and described above with reference to FIG. 1. Accordingly, the cable 200 may include a plurality of twisted pair components 205A-F disposed in a cable core and stranded around a central member 210. An outer jacket 215 may enclose the internal components of the cable 200.

The central member 210 illustrated in FIG. 2 has a different cross-sectional shape than the central member 110 of FIG. 1. More specifically, the central member 210 includes a plurality of prongs, projections, or fins 220 extending from a body portion of the central member 210. As shown, a respective prong extends between each adjacent pair of twisted pair components 205A-F; however, in other embodiments, other numbers of prongs may be utilized. Additionally, each prong may be formed with a wide variety of suitable dimensions, such as a wide variety of suitable cross-sectional shapes, lengths, and/or thicknesses.

The central member 210 of FIG. 2 is also illustrated as including a plurality of longitudinal channels 225A, 225B. Additionally, an internal spline, rib or support 230 may be positioned between the longitudinal channels 225A, 225B. As desired in various embodiments, the central member 210 may include any number of longitudinal channels. Additionally, a wide variety of suitable internal structures including, but not limited to, extruded material, ribs, splines, etc., may be incorporated into the central member 210.

Additionally, for the twisted pair components 205A-F illustrated in FIG. 2, each of the twisted pairs may be individually shielded. For example, instead of including an overall shield formed around the plurality of twisted pairs, shield layers may respectively be wrapped or otherwise formed around each of the twisted pairs. In other embodiments, a portion or none of the twisted pairs may be individually shielded. As desired, an overall shield may be formed around any number of individually shielded twisted pairs. Indeed, a wide variety of different shielding arrangements may be utilized in accordance with various embodiments of the disclosure.

FIG. 3 is a cross-sectional view of another example cable 300 including a central member with at least one longitudinal channel that facilitates convective heat transfer, according to an illustrative embodiment of the disclosure. The cable 300 of FIG. 3 may include components that are similar to the cables 100, 200 illustrated and described above with reference to FIGS. 1 and 2. Accordingly, the cable 300 may include a plurality of twisted pair components 305A-D disposed in a cable core, and stranded around a central member 310. An outer jacket 315 may enclose the internal components of the cable 300.

The central member 310 of FIG. 3 may be similar to the central member 110 of FIG. 1; however, the central member 310 of FIG. 3 may have a larger diameter and/or cross-sectional area than the central member 110 of FIG. 1. In FIG. 1, the central member 110 is sized to be approximately equal to the twisted pairs components 105A-F and, therefore, a six around one construction is formed. The central member 310 of FIG. 3 may be larger than the twisted pair components 305A-D. Accordingly, more than six components may be stranded or otherwise formed around the central member 310. As shown, eight components are formed around the central member 310; however, any other embodiments, any desired number of components may be formed around a central member.

The twisted pair components 305A-D of FIG. 3 may be similar to those described above with reference to FIG. 1. However, only four twisted pair components are illustrated in FIG. 3. The cable 300 additional includes a plurality of other components formed around the central member 310. As desired, any number of and/or a wide variety of various types of components may be incorporated into a cable. For example, one or more optical fiber components, coaxial cable components, power conductors, and/or other transmission media may be incorporated into a cable. As shown in FIG. 3, a plurality of optical fiber components 320, 325, 330 are formed around the central member 310. For example, an optical fiber component 320 that includes one or more tight buffered optical fibers encased in a suitable buffer tube, jacket layer, strength layer, and/or other covering may be incorporated into the cable 300. As another example, an optical fiber component 325 that includes a plurality of optical fibers incorporated into one or more loose buffer tubes, microtubes and/or other sheaths may be incorporated into the cable 300. As yet another example, an optical fiber component 330 that includes one or more optical fiber ribbons encased in a suitable buffer tube, jacket layer, strength layer, and/or other covering may be incorporated into the cable 300. Additionally, in certain embodiments, one or more spacing elements 335 and/or strength members (e.g., strength rods, etc.) may be incorporated into the cable 300 in place of transmission media in order to provide the cable 300 with a desired cross-sectional profile.

Similar to the cable 100 illustrated in FIG. 1, the cables 200, 300 illustrated in FIGS. 2 and 3 are provided by way of example only. Embodiments of the disclosure contemplate a wide variety of other cables and cable constructions. These other cables may include more or less components than the cables 200, 300 illustrated in FIGS. 2 and 3. For example, other cables may include alternative shielding arrangements and/or different types of central members. Additionally, certain components may have different dimensions and/or materials than the components illustrated in FIGS. 2 and 3.

Example Twisted Pair Component Constructions

A few example twisted pair components are illustrated and described above with reference to FIGS. 1-3. In particular, FIGS. 1 and 3 illustrate twisted pair components that include a cross-shaped separator positioned between a plurality of twisted pairs and an overall shield formed around the twisted pairs and the separator. FIG. 2 illustrates a twisted pair component that includes individually shielded twisted pairs and an optional binder that holds the pairs together. In other embodiments, a wide variety of other suitable twisted pair component constructions may be utilized. A few non-limiting examples of twisted pair components are illustrated in FIGS. 4A-4D. Any of these twisted pair components, as well as other types of components, may be incorporated into a cable that includes a central member that provides a cooling function.

Figure 4A:
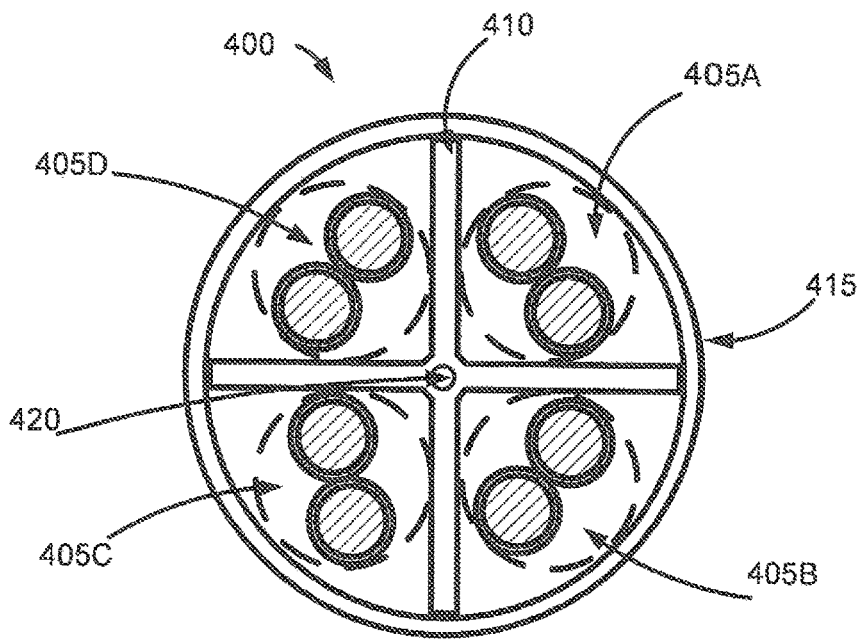
FIGS. 4A-4D are cross-sectional views of example twisted pair components that may be incorporated into cables, according to illustrative embodiments of the disclosure.

Turning first to FIG. 4A, an example twisted pair component 400 is illustrated that includes a plurality of twisted pairs 405A-D with a separator 410 having an approximately X-shaped cross-sectional positioned between the twisted pairs 405A-D. Additionally, an overall shield layer 415 is formed around the twisted pairs 405A-D and the separator 410. In this regard, the twisted pair component 400 may be similar to the components 105A-F, 305A-D described above with reference to FIGS. 1 and 3. However, in contrast to the components illustrated in FIGS. 1 and 3, the separator 410 of the twisted pair component 400 is illustrated as including a longitudinal channel 420 that may provide for convective heat transfer that assists in cooling and/or normalizing the temperature within the twisted pair component 400. As desired in various embodiments, the separator 410 may include a wide variety of other components, such as second channels, shielding material, and/or heat sinks.

Figure 4B:
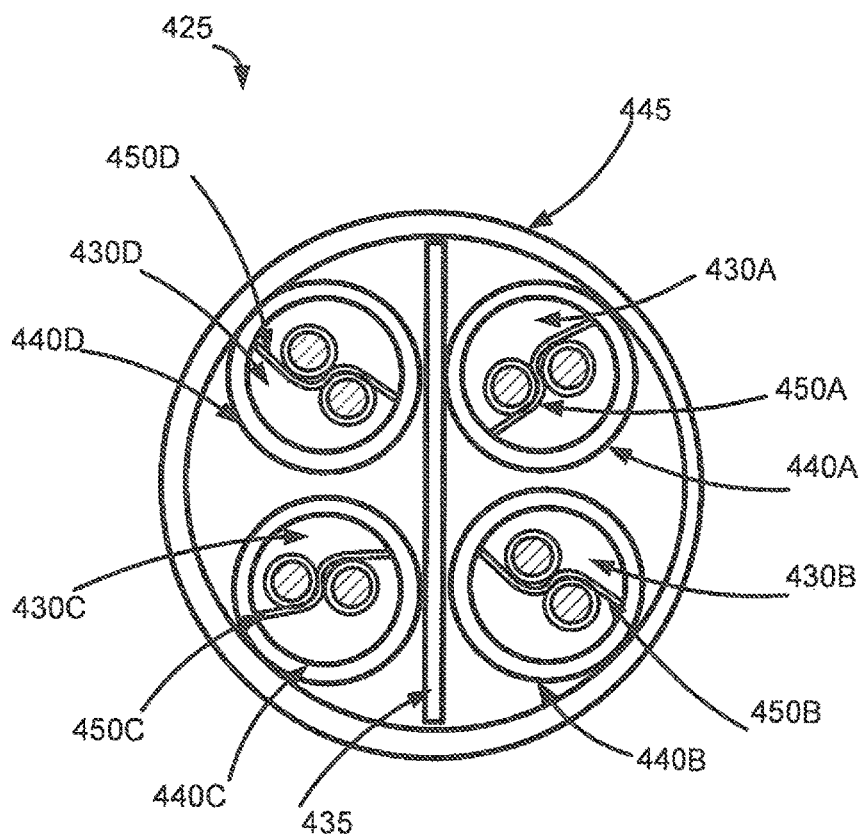

FIG. 4B illustrates another example twisted pair component 425 that includes a plurality of twisted pairs 430A-D. Additionally, the twisted pair component 425 may include a separator 435 formed between at least two of the twisted pairs 430A-D. For example, the twisted pair component 425 may include a relatively flat separator 435 that approximately bisects the core of the twisted pair component 425 such that two pairs are positioned on either side of the separator 435. In various embodiments, the separator 435 may include one or more longitudinal channels, one or more second channels, shielding material, heat sinks, and/or a wide variety of other suitable components.

With continued reference to FIG. 4B, individual shield layers 440A-D may be respectively formed around each of the twisted pairs 430A-D. For example, a first shield layer 440A may be formed around a first twisted pair 430A; a second shield layer 440B may be formed around a second twisted pair 430B; a third shield layer 440C may be formed around a third twisted pair 430C; and a fourth shield layer 440D may be formed around a fourth twisted pair 430D. Additionally, in certain embodiments, an overall shield 445 may be formed around the individually shielded twisted pairs 430A-D and the separator 435. Indeed, as described in greater detail above, a twisted pair component may be formed with a wide variety of suitable shielding arrangement.

In certain embodiments, respective dielectric separators 450A-D may be woven helically between the individual conductors or conductive elements of one or more of the twisted pairs 430A-D. In other words, a dielectric separator (generally referred to as dielectric separator 450) may be helically twisted with the conductors of a twisted pair 430 along a longitudinal length of the twisted pair component 425. In certain embodiments, the dielectric separator 450 may maintain spacing between the individual conductors of the twisted pair 430 and/or maintain the positions of one or both of the individual conductors. For example, the dielectric separator 450 may be formed with a cross-section (e.g., an X-shaped cross-section, an H-shaped cross-section, etc.) that assists in maintaining the position(s) of one or both the individual conductors of the twisted pair 430. In other words, the dielectric separator 450 may reduce or limit the ability of one or both of the individual conductors to shift, slide, or otherwise move in the event that certain forces, such as compressive forces, are exerted on the twisted pair component 425. As illustrated in FIG. 4B, a dielectric separator 235 may be formed as a relatively simple film layer that is positioned between the individual conductors of a twisted pair 430.

Figure 4C:
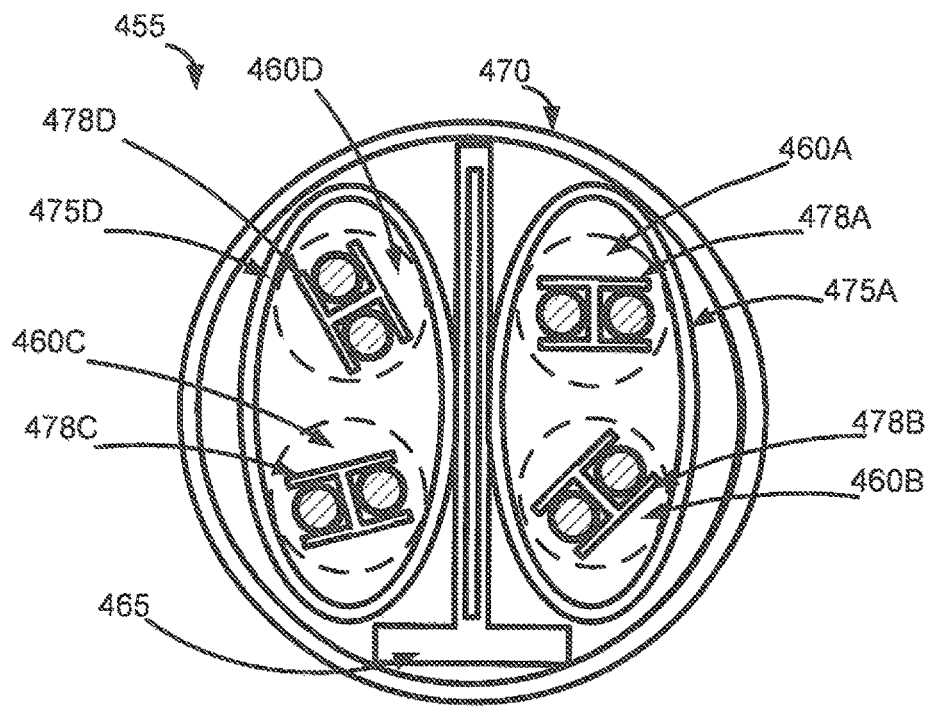

FIG. 4C illustrates another example twisted pair component 455 that includes a plurality of twisted pairs 460A-D. In certain embodiments, the twisted pair component 455 may include a separator 465 formed between at least two of the twisted pairs 460A-D. The separator 465 illustrated in FIG. 4C has a different construction than the separators 410, 435 illustrated in FIGS. 4A and 4B. In particular, the separator 465 is a generally T-shaped separator that approximately bisects (or otherwise divides) the cable core and forms two channels along a longitudinal length of the twisted pair component 455. In one example embodiment, two twisted pairs 460A, 460B can be disposed in a first channel and the remaining two twisted pairs 460C, 460D can be disposed in a second channel. The separator 465 further includes one or more prongs formed at or near one end of the separator 465. The prong(s) may assist in anchoring the separator 465 to an outer shield layer 470 (or other layer that surrounds the core of the twisted pair component 455), thereby limiting movement of the separator 465. Additionally, in various embodiments, the separator 465 may include one or more longitudinal channels, one or more second channels, shielding material, heat sinks, and/or a wide variety of other suitable components.

With continued reference to FIG. 4C, any number of shield layers may be utilized to provide shielding for the twisted pairs 460A-D. For example, a first shield layer 475A may be wrapped or otherwise formed around two of the twisted pairs, such as the twisted pairs 460A, 460B disposed in the first channel. A second shield layer 475B may be wrapped or otherwise formed around other twisted pairs, such as twisted pairs 460C, 460D disposed in the second channel. In other words, shield layers may be provided for various groups of twisted pairs. Additionally, in certain embodiments, an overall shield 470 may be formed around the components incorporated into the core of the twisted pair component 455.

Additionally, respective dielectric separators 478A-D having an H-shaped cross-section are illustrated in FIG. 4C as being disposed or positioned between the individual conductors of the various twisted pairs 460A-D. As described in greater detail above with reference to FIG. 4B, these dielectric separators 478A-D may assist in maintaining the position(s) of one or both the individual conductors of the twisted pairs 460A-D.

Figure 4D:
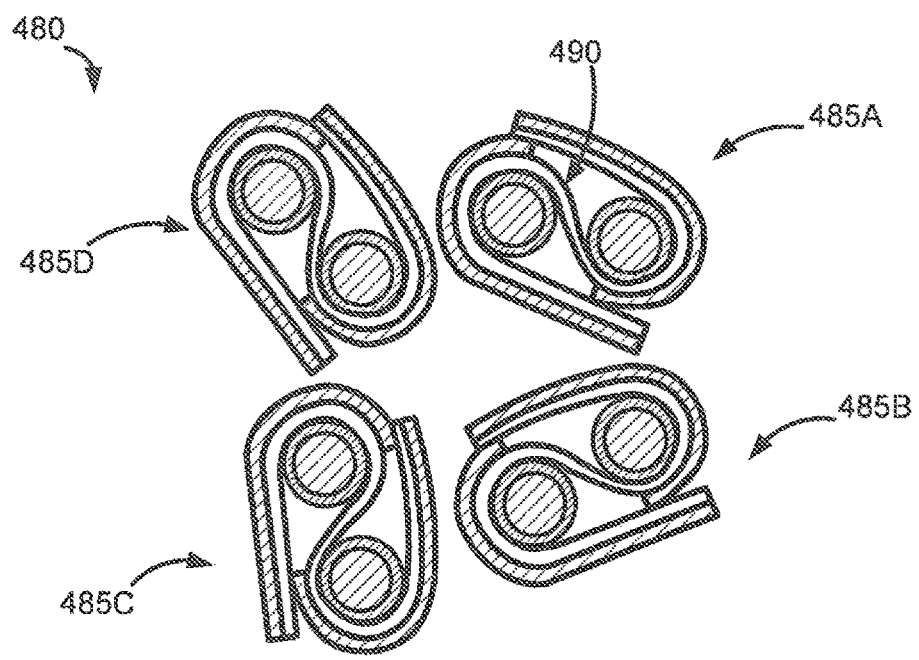

FIG. 4D illustrates another example twisted pair component 480 that includes a plurality of twisted pairs 485A-D. As shown, no separator is positioned between any of the twisted pairs 485A-D. Additionally, each of the twisted pairs (generally referred to as twisted pair 485) includes a respective component 490 that acts as both a dielectric separator and as an individual shield for the twisted pair 485. The component 490 may include a first portion that is positioned between the individual conductors of the twisted pair and/or one or more second portions that include shielding material and that are wrapped around an outer periphery of the twisted pair 485. As shown, respective second portions extend from either end of the first portion, and each of the second portions is wrapped partially around the outer periphery of the twisted pair 485 until they contact one another, thereby forming a shield layer. In other embodiments, a single second portion may extend from one end of the first portion, and the second portion may be wrapped around the entire outer periphery of the twisted pair 485. Additionally, although the first portion is illustrated as a relatively flat tape that is positioned between the conductors, in other embodiments, a first portion may be formed with other dimensions. For example, a first portion may have an H-shape or other suitable cross-sectional shape. Indeed, a wide variety of configurations may be utilized as desired for a composite component that functions as both a dielectric separator and a shield.

The twisted pair components 400, 425, 455, 480 illustrated in FIGS. 4A-D, as well as the twisted pair components illustrated in FIGS. 1-3, are provided by way of example only. Embodiments of the disclosure contemplate a wide variety of other twisted pair component constructions. These other twisted pair components may include more or less components than the twisted pair components illustrated in FIGS. 1-4D. For example, other cables may include alternative shielding arrangements and/or different types of separators. Additionally, certain components may have different dimensions and/or materials than the components illustrated in FIGS. 1-4D.

Example Central Member Constructions

As set forth above, a central member, such as the central member 110 illustrated in FIG. 1, may be formed with a wide variety of suitable constructions, cross-sectional shapes, and/or dimensions. FIGS. 5A-5I are perspective views of example central member constructions, and the example constructions illustrate a few of the different features that may be incorporated into central members. Similar to the central member 100 shown in FIG. 1, the central member of FIGS. 5A-5I may have a generally rod-shaped or circular cross-section or body portion with any number of optional prongs or fins extending therefrom. As desired in other embodiments, a wide variety of other cross-sectional shapes may be utilized, such as any of the cross-sectional shapes illustrated in FIGS. 6A-6H. Additionally, in accordance with an aspect of the disclosure, each of the example central members may include one or more longitudinal channels. Further, any of the example central members may be incorporated into a wide variety of cables, such as the cables 100, 200, 300 illustrated in FIGS. 1-3. In other words, any of the central members illustrated in FIGS. 5A-6H may be substituted into the cables 100, 200, 300 discussed above and/or incorporated into any other suitable cable designs.

Figure 5A:
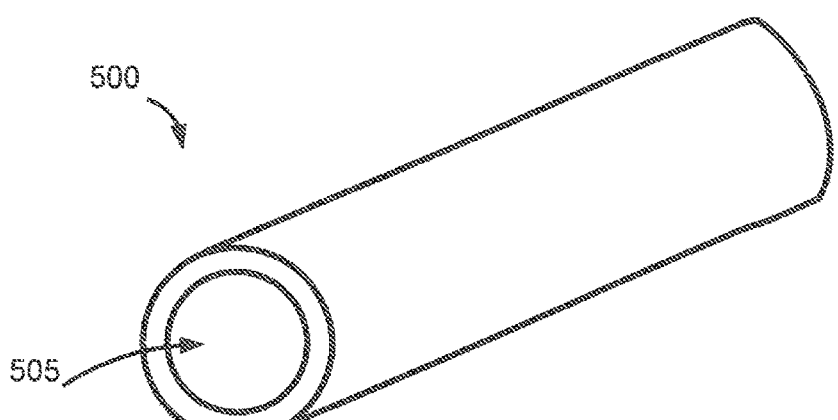
FIGS. 5A-5I are perspective views of example central members that may be incorporated into cables in accordance with various illustrative embodiments of the disclosure.

Turning first to FIG. 5A, a perspective view of a first example central member 500 is illustrated. The central member 500 may be formed with any desired shape, size, diameter, cross-sectional area, and/or other dimensions. Additionally, the central member 500 may include at least one longitudinal channel 505 that facilitates convective heat transfer along a longitudinal length of the central member 500. As described above with reference to FIG. 1, any number of longitudinal channels may be incorporated into the central member 500, and each longitudinal channel may have any desired shape, size, and/or other dimensions. Further the longitudinal channel 505 may define an internal cavity through the body of the central member 500.

Figure 5B:
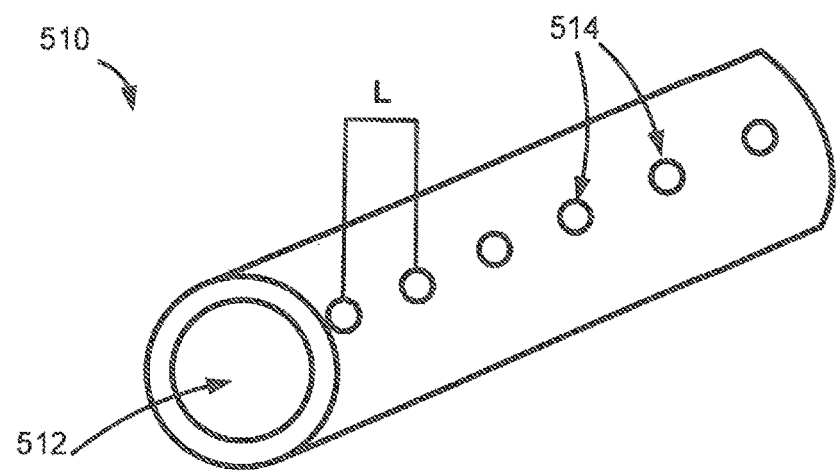

FIG. 5B illustrates another example central member 510 that includes at least one longitudinal channel 512. Additionally, the central member 510 may include a plurality of second channels 514. Each second channel 514 may extend from the longitudinal channel 512 through the body of the central member 510 and to an external surface of the central member 510. In this regard, each second channel 514 may permit the flow of air or other fluid between the longitudinal channel 512 and portions of the core of a cable into which the central member 510 is positioned. As a result, overall convective heat transfer rate of the central member 510 may be enhanced. For example, heat may pass from outside of the central member 510 (e.g., from one or more twisted pair components, etc.) to the longitudinal channel 512 via one or more second channels 514, and the longitudinal channel 512 may facilitate heat transfer/cooling along a longitudinal length of the central member 500 and/or cable in which the central member 510 is incorporated.

As set forth in greater detail above with reference to FIG. 1, each of the second channels 514 may have any suitable shape (e.g., circular, elliptical, etc.), size (e.g., diameter, etc.), and/or other dimensions. Each second channel 514 may also be formed at any desired angle relative to the longitudinal channel 512 (e.g., a ninety degree angle, an acute angle, etc.). Additionally, any number of second channels 514 may be incorporated into the central member 510. A wide variety of configurations and/or arrangements of second channels may be utilized. In certain embodiments, one or more second channels may be positioned at a plurality of respective points along the longitudinal length of the central member. For example, second channels 514 may be spaced along the central member 510 in a pattern or with a repeating step. A wide variety of suitable spacings or distances "L" may be present between second channels, such as spacings of approximately 0.05 meters, 0.1 meters, 0.25 meters, 0.5 meters, 1.0 meters, 1.5 meters, 2.0 meters, 2.5 meters, 3.0 meters, 4.0 meters, 5.0 meters, a spacing included in a range between any two of the above values, and/or a spacing that is included in a range bounded on either a minimum or maximum end by one of the above values. In other embodiments, second channels 514 may be positioned along the central member 510 in accordance with a random or pseudo-random pattern.

In certain embodiments, a single second channel may be formed at each respective cross-sectional location along a longitudinal length of a central member. In other embodiments, as illustrated by the central member 515 of FIG. 5C, a plurality of second channels may be formed at one or more cross-sectional locations at which second channels are positioned. For example, a first one of the second channels 517 may open at a first point along an outer periphery of the central member 515 (e.g., a location proximate to a first twisted pair component) while a second one of the second channels 519 may open at a second point along an outer periphery of the central member 515 (e.g., a location proximate to a second twisted pair component). Any number of second channels may be formed at a given location. For example, a second channel may be formed that corresponds to each of the twisted pair components. As another example, a second channel may be formed that corresponds to each prong or extension of a central member.

In other embodiments, one or more second channels having a first orientation may be formed at a first longitudinal position along a central member while one or more additional second channels having a second orientation may be formed at a second longitudinal position along the central member. For example, at a first position, a second channel may be formed that opens at a location proximate to a first twisted pair component and, at a second position, an additional second channel may be formed that opens at a location proximate to a second twisted pair component. As another example, second channels may be formed completely through a central member, and the direction of the formation may be altered such that a first one of the second channels opens proximate to a first set of twisted pair components, while a second one of the second channels opens proximate to a second set of twisted pair components, and so on. A wide variety of other suitable configurations may be utilized as desired, and those discussed herein are provided by way of example only.

Figure 5C:
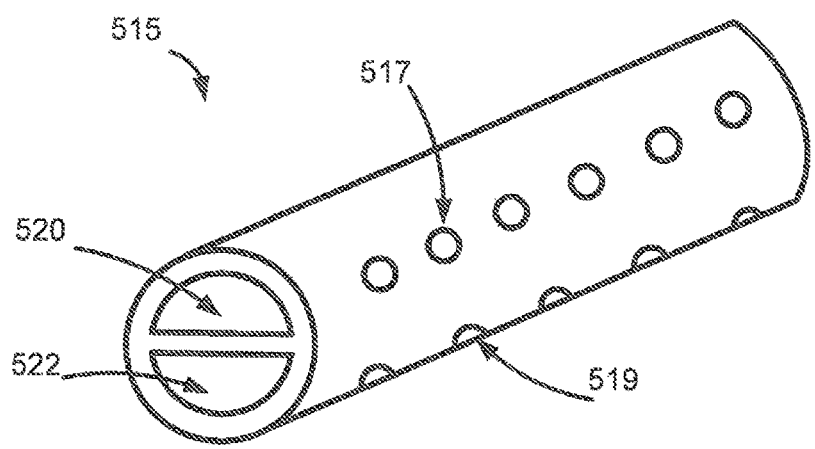

A wide variety of suitable methods and/or techniques may be utilized to form second channels, such as the second channels 514, 517, 519 illustrated in FIGS. 5B and 5C. In certain embodiments, one or more suitable punches, drills, blades, laser, or other suitable cutting tools may be utilized to form second channels either partially or completely through the body of a central member. For example, a channel may be formed from an external surface of a central member through the body to a longitudinal channel. In this regard, a single second channel may be formed. As another example, a channel may be formed completely through a central member such that it passes through a longitudinal channel. In this regard, two second channels may be formed. In certain embodiments, a central member may be passed through or near the cutting tool(s) such that second channels may be formed at various locations along the longitudinal length of the central member. As desired, a first set of one or more cutting tools may be utilized to form second channels having a first orientation, and a second set of one or more cutting tools may be utilized to form second channels having a second orientation, and so on. Any number of cutting tools and/or sets of cutting tools may be utilized in various embodiments in order to form a central member with a desired configuration of second channels.

With continued reference to FIG. 5C, a central member 515 may be formed that includes a plurality of longitudinal channels, such as longitudinal channels 520, 522. Each of the longitudinal channels 520, 522 may be formed with any desirable cross-sectional shapes and/or dimensions. Additionally, as desired, any number of ribs, internal supports, spokes, and/or sections of a body portion of the central member 515 may separate the longitudinal channels 520, 522 from one another. In certain embodiments, a plurality of longitudinal channels 520, 522 may be isolated from one another. In other words, fluid positioned in a first longitudinal channel 520 may not be permitted to migrate into a second longitudinal channel 522. In other embodiments, two or more longitudinal channels 520, 522 may be in fluid communication with one another. For example, one or more channels or passageways may be formed between the longitudinal channels 520, 522. As another example, two or more longitudinal channels 520, 522 may be connected at one or more ends of the central member 515 such that fluid may be recirculated through the channels 520, 522.

Figure 5D:
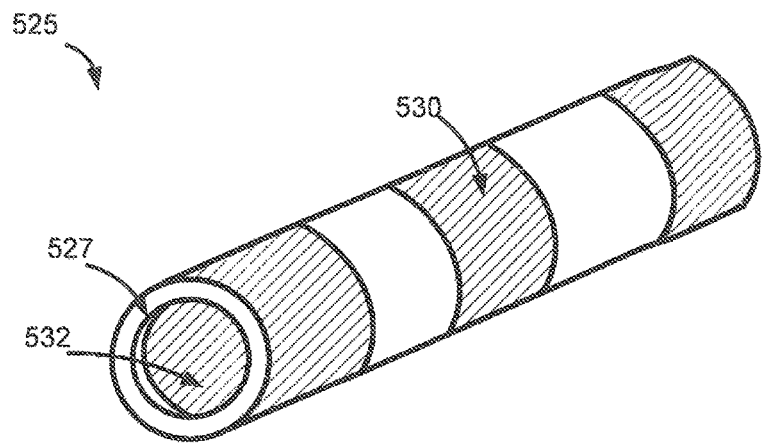

FIG. 5D illustrates another example central member 525 that may facilitate convective heat transfer along its longitudinal length. Much like the central members 500, 510, 515 of FIG. 5A-C, the central member 525 of FIG. 5D may include one or more longitudinal channels, such as the illustrated longitudinal channel 527. Additionally, the central member 525 may include shielding material that provides electromagnetic shielding for the twisted pair components and/or other transmission media incorporated into a cable. As shown, the central member 525 may include first shielding material 530 formed on its external surface and second shielding material 532 formed inside the longitudinal channel 527, for example, on a surface that defines the longitudinal channel 527.

As set forth above with reference to FIG. 1, a wide variety of suitable types of shielding material may be utilized, such as electrically conductive material (e.g., aluminum, etc.). Additionally, shielding material may be formed in accordance with a wide variety of suitable configurations. For example, in certain embodiments, relatively continuous shielding material may be formed along a longitudinal length of the central member 525. In other embodiments, discontinuous patches of shielding material may be formed, and dielectric spaces or gaps may be present between adjacent patches. A wide variety of suitable patterns of shielding material may be utilized as desired, and a few example patterns are described in greater detail below with reference to FIGS. 7A-7G. These patterns may include a wide variety of patch sizes and/or dimensions, as well as a wide variety of suitable gap sizes between patches. Additionally, in certain embodiments, discontinuous patches of shielding material may be formed in a random or pseudo-random manner.

Additionally, a wide variety of different relationships may exist between the shielding material 530 formed on an external surface of the central member 525 and the shielding material 532 formed inside the longitudinal channel 527. For example, in certain embodiments, a similar pattern may be formed on the external surface and within the longitudinal channel 527. In other embodiments, the patches of shielding material 532 formed within the longitudinal channel 527 may correspond to or cover gaps or spaces between adjacent patches of shielding material 530 formed on the external surface and vice versa. In yet other embodiments, a first patch pattern may be utilized on the external surface while a second patch pattern is utilized within the longitudinal channel 527. In yet other embodiments, a first pattern may be utilized on the external surface, and a random or pseudo-random patch configuration may be utilized within the longitudinal channel 527. In yet other embodiments, a first pattern may be utilized on the external surface, and a continuous layer of shielding material may be formed within the longitudinal channel 527 or vice versa. Indeed, a wide variety of different patterns and/or shielding configurations may be incorporated into the central member 525.

A wide variety of suitable methods or techniques may be utilized to form shielding material on both the external surface of the central member 525 and/or within the longitudinal channel 527. For example, once the central member 525 has been formed (e.g., extruded, molded, etc.), shielding material may be deposited on, adhered to, or otherwise formed on or attached to the central member 525. Examples of suitable methods for forming shielding material include, but are not limited to, application of metallic ink or paint, liquid metal deposition, vapor deposition, welding, heat fusion, adherence of patches to the dielectric, and/or etching of patches from a metallic sheet.

Although each patch of shielding material formed on an external surface of the central member 525 is illustrated as being formed around an outer periphery of the central member 525, other embodiments may be formed with different configurations. For example, in certain embodiments, a patch formed on the external surface may only extend partially around the outer periphery of the central member 525. In certain example embodiments, a patch may extend approximately 16%, 20%, 25%, 33%, 40%, 50%, 66%, 75%, or any other suitable percentage around an outer periphery of the central member 525. In certain embodiments, each patch may cover a portion of the central member 525 that is proximate to one of the twisted pair components. As desired in various embodiments, a patch may cover any desired portion of the surface of a central member 525 and/or may extend any desired amount around an outer periphery of the central member 525 and/or any prongs.

Additionally, in certain embodiments, patches of shielding material may be alternated between various portions of the central member 525 along its longitudinal length. In certain embodiments, patches may be formed diagonally across from each other at any given longitudinal location, and a patch pattern may be alternated along the central member's longitudinal length. For example, given the cable construction illustrated in FIG. 1, first patches may be formed proximate to a first and fourth twisted pair component 105A, 105D; second patches may be formed proximate to a second and fifth twisted pair component 105B, 105E; and third patches may be formed proximate to a third and sixth twisted pair component 105C, 105F. A wide variety of other suitable patch configurations may be formed as desired in various embodiments. For example, patches may be alternated between individual quadrants, sextants, or other sections of a central member along its longitudinal length. As another example, patches may be altered between a top half and a bottom half of a central member along its longitudinal length. The patch configurations discussed herein are provided by way of non-limiting example only. Further, a wide variety of suitable patch configurations may be formed within a longitudinal channel 527 of the central member 525.

Figure 5E:
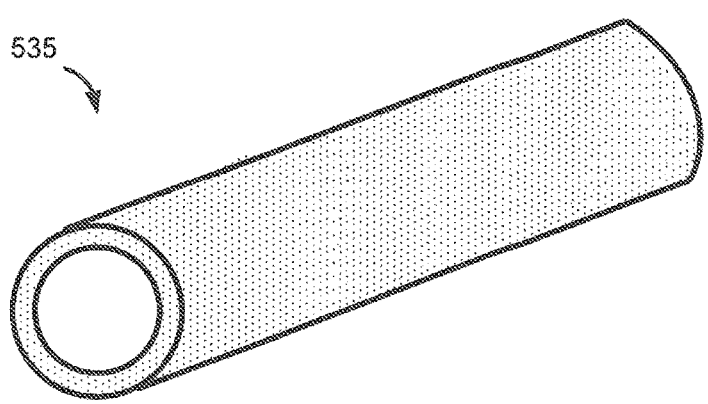

FIG. 5E illustrates another example central member 535 that may be utilized in various embodiments of the disclosure. In contrast to central members having shielding material formed on one or more surfaces, the central member 535 of FIG. 5E may include a body portion (and optionally other portions such as prongs or fins) that is at least partially formed from a shielding material. Additionally, the central member 535 may include any number of longitudinal channels and, as desired in various embodiments, any number of secondary channels.

A wide variety of suitable shielding materials may be incorporated into the central member 535 as desired in various embodiments. In certain embodiments, the central member 535 may be formed (e.g., extruded, molded, etc.) from a suitable shielding material. Examples of suitable materials that may be utilized to form the central member 535 include, but are not limited to, one or more metallic materials (e.g., silver, copper, nickel, steel, iron, annealed copper, gold, aluminum, etc.), metallic alloys, conductive composite materials, semi-conductive materials (e.g., silicon, etc.), and/or dielectric shielding materials (e.g., barium ferrite, etc.). In other embodiments, shielding material may be mixed or blended into a suitable base material (e.g., a polymeric material, etc.) that is utilized to form the central member 535. In yet other embodiments, shielding material may be embedded in a base material or suspended within a matrix of base material.

Figure 5F:
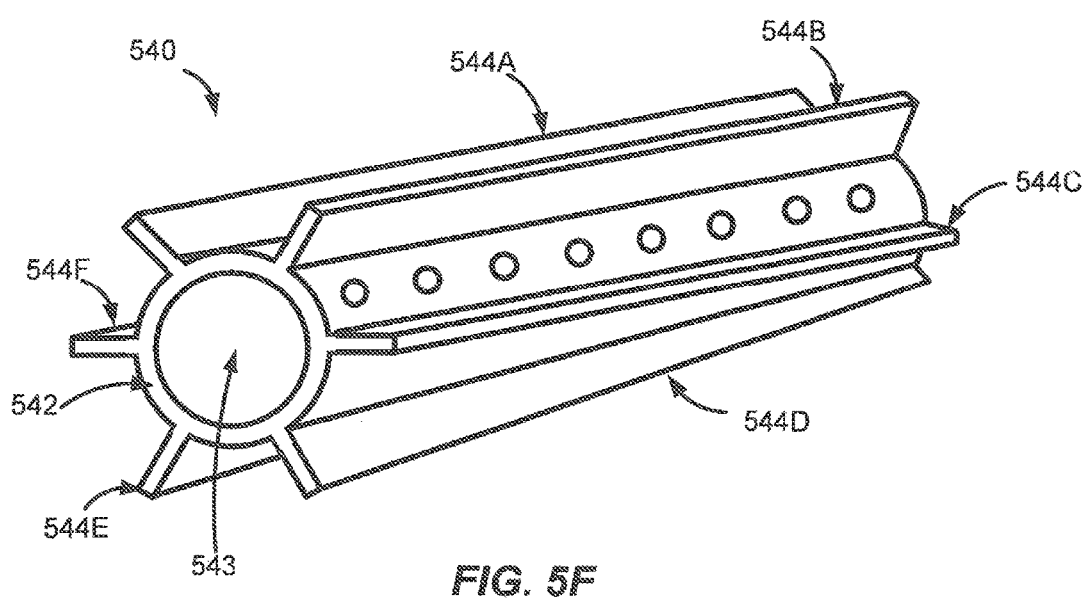

Turning now to FIG. 5F, another example central member 540 construction is illustrated. The central member 540 may include a central portion 542 that includes a longitudinal channel 543, and any number of prongs, fins, extensions, or projections 544 may extend from the central portion 542. As shown, the central member 540 may include six prongs 544A-F, and each prong may respectively extend between two of the twisted pairs components formed around the central member 540. Additionally, as desired in various embodiments, the central member 540 may include any number of second channels and/or a wide variety of suitable shielding material may be incorporated into the central member 540.

In certain embodiments, the central portion 542 and the prongs 544A-F may be formed from the same material or group of materials. For example, the central member 540 and its various components may be extruded or otherwise formed as a unitary structure. In other embodiments, the central portion 542 and one or more prongs 544A-F may be formed from different materials or groups of materials. For example, the central portion 542 may be formed from a polymeric material, and one or more prongs 544A-F may be formed from and/or may include suitable shielding material. For example, a prong (generally referred to as prong 544) may be formed (e.g., molded, case, extruded, etc.) from a suitable shielding material. As another example, shielding material may be mixed into, blended into, or embedded within a base material to form a prong 544. As yet another example, shielding material may be formed on the surface of a prong 544. As set forth above, a wide variety of suitable shielding materials may be utilized.

In the event that a prong 544 is formed from different materials or includes a different base material than the central portion 542, a wide variety of suitable techniques may be utilized to attach the prong 544 to the central portion 542. For example, the prong 544 may extend through the central portion 542 into a longitudinal channel 543. As desired, an end of the prong 544 positioned within the longitudinal channel 543 may be processed (e.g., folded over, widened, etc.) such that the prong 544 is held in place. In other embodiments, a single prong 544 may extend through the longitudinal channel 543 such that it extends from opposite sides of the central portion 542. As desired in various embodiments, a prong 544 may be adhered, welded, or otherwise attached or affixed to the central portion 542.

In certain embodiments, such as embodiments in which a prong 544 is formed from a shielding material, a prong 544 may function as a heat sink that pulls or draws heat into a longitudinal channel 543. In this regard, the prong 544 may assist in cooling a cable and/or normalizing a temperature within the cable. Additionally, in certain embodiments, a prong 544 may be completely formed from or may include continuous shielding or heat sink material along a longitudinal length of the central member 540. In other embodiments, one or more respective portions positioned along a longitudinal length of a prong 544 may include shielding and/or heat sink material. For example, a prong 544 may be formed from alternating metallic and dielectric portions. As desired, various sections of a prong 544 may have any suitable longitudinal lengths and/or other dimensions. Further, sections may be arranged in accordance with a wide variety of suitable patterns or, alternatively, sections may be arranged in a random or pseudo-random manner. A few of the examples discussed herein with respect to patch configurations may be equally applicable to prong construction.

The example central member illustrated in FIG. 5F illustrates second channels that are formed through portions of the central member 540 other than the extensions or prongs. In other words, second channels may be formed through central members such that they open in proximity to twisted pair components positioned adjacent to the central member. In other embodiments, second channels may be formed through other portions of a central member. For example, second channels may be formed through one or more of the prongs of a central member. In certain embodiments, a second channel may be formed from the longitudinal channel through a prong such that it opens at the distal end of the prong. In other embodiments, a second channel may be formed at an angle through a prong or, alternatively, a second channel may curve, bend, or change direction within a prong. In this regard, the second channel may open along a surface of the prong that faces at least one twisted pair component.

Figure 5G:
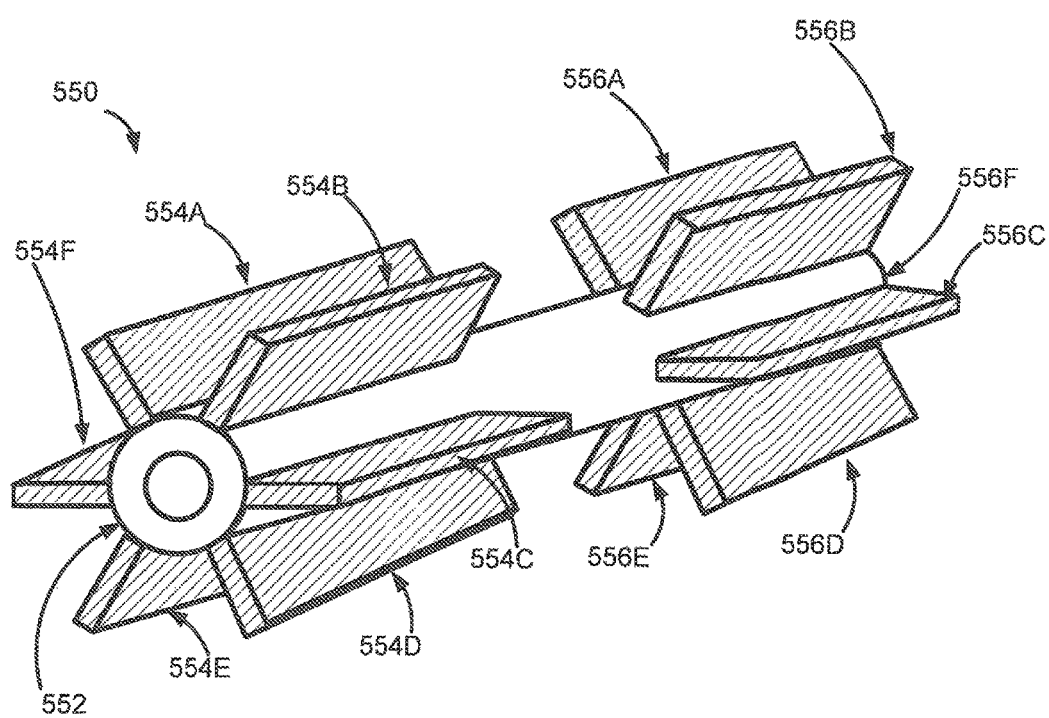

FIG. 5G illustrates another example central member 550 in which one or more prongs are attached to a central portion 552. However, in contrast to the central member 540 of FIG. 5F, each of the prongs in FIG. 5G does not extend along a continuous longitudinal length of the central member 550. In other words, a first set of prongs 554A-F may be formed at a first location along a longitudinal length of the central member 550, a second set of prongs 556A-F may be formed at a second location along the longitudinal length of the central member 550, and so on. A gap or spacing, such as an air gap, may be present between adjacent prongs in each of the sets. Each of the prongs may be formed from a wide variety of suitable materials and/or with a wide variety of suitable dimensions. As shown, each of the prongs is formed from a shielding and/or heat sink material. In other embodiments, a portion of the prongs may be formed from shielding and/or heat sink material while another portion of the prongs is formed from other materials (e.g., dielectric materials, flame retardant materials, etc.). Further, as desired, only a portion of a given prong may be formed from or include shielding and/or heat sink material. Indeed, prongs may be formed with a wide variety of suitable constructions.

As desired, the construction of prongs may be varied within a given set of prongs and/or between sets of prongs. For example, a first set of prongs may be formed as heat sinks while another set of prongs is formed from alternate materials (e.g., dielectric material, etc.). As desired, dimensions of prongs may vary between different sets. For example, a first set of prongs that functions as heat sinks may have first longitudinal lengths, and a second set of prongs formed from different materials may have second longitudinal lengths. Additionally, although FIG. 5G only illustrates prongs that do not extend along the longitudinal length of the central member 550, in other embodiments, a portion of the prongs may be continuous along the longitudinal length of the central member 550 while another portion of the prongs does not extend along the longitudinal length. Indeed, a wide variety of suitable prong arrangements and/or constructions may be utilized in various embodiments, and those described herein are provided by way of non-limiting example only.

Figure 5H:
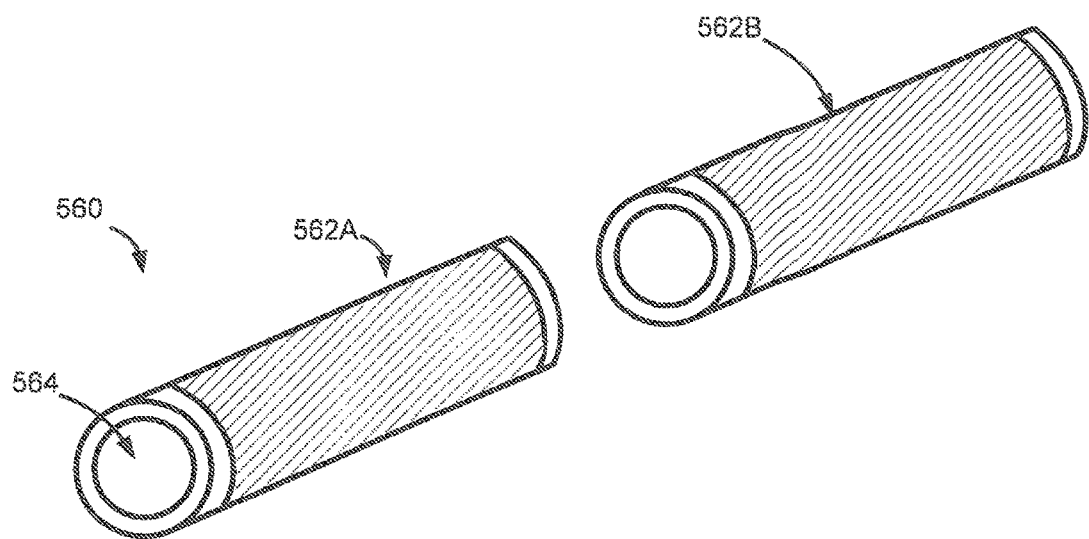
Figure 5I:
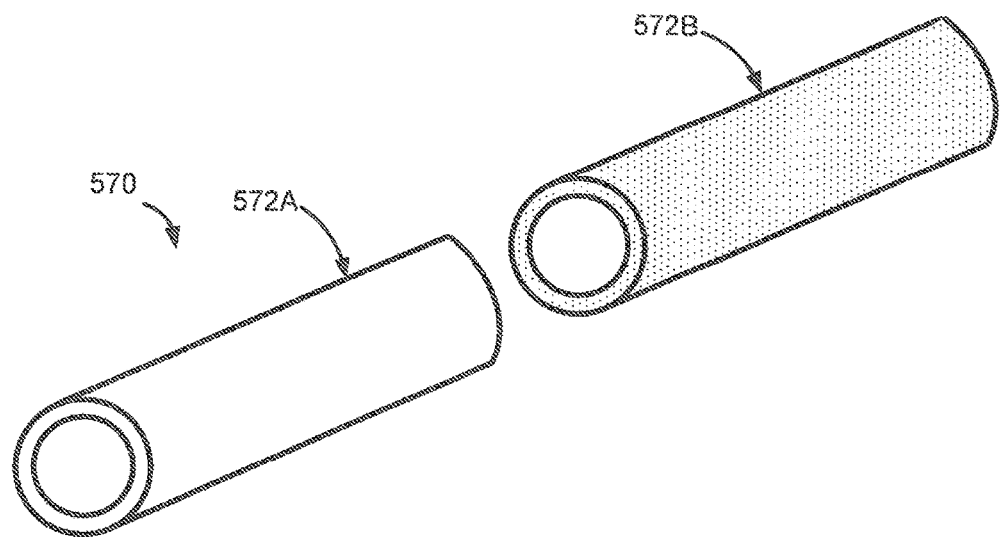

The central members illustrated in FIGS. 5A-5G are continuous along their entire longitudinal length. In other words, each of the central members includes at least one portion that is continuous along the entire longitudinal length. In other embodiments, a central member may be formed from a plurality of severed or discrete portions that are arranged adjacent to one another (e.g., end to end) along a longitudinal length of a cable. FIGS. 5H and 5I illustrate examples of severed central members that include a plurality of discrete portions. Much like the central members discussed above with reference to FIGS. 5A-5G, the central members of FIGS. 5H and 5I may include at least one longitudinal channel and, as desired, second channel(s), shielding material, prongs, and/or heat sinks.

Turning first to FIG. 5H, a first example severed central member 560 is illustrated. The central member 560 may include any number of discrete segments or portions, such as segments 562A and 562B. None of the segments or portions will individually extend along an entire longitudinal length of the central member 560 or a cable into which the central member 560 is incorporated. However, the segments may be arranged end to end in order to form a longitudinally extending central member 560. As explained in greater detail above with reference to FIG. 1, each of the segments may have a wide variety of constructions and/or dimensions (e.g., cross-sectional shapes, lengths, etc.).

A respective longitudinal channel is formed through a body portion of each of the illustrated segments 562A, 562B. When the segments are arranged end to end, a single longitudinal channel 564 may extend along the length of the central member 560. In certain embodiments, the segments may be arranged such that they contact one another at the edges. Such an arrangement provides for enhanced flexibility of the central member 560; however, the longitudinal channel 564 may be approximately continuous along the central member's length. As desired, one or more of the segments 562A. 562B may additionally include one or more second channels formed from the longitudinal channel 564 to an external surface.

Additionally, in certain embodiments, shielding material may be incorporated into one or more segments 562A, 562B of the central member 564. For example, as illustrated, shielding material may be formed on one or more surfaces of one or more central member segments 562A, 562B, such as a surface of the longitudinal channel 564 and/or on an external surface. In certain embodiments, a single patch of shielding material may be formed on each central member segment. Additionally, the shielding material formed on a segment may not extend all the way to at least one of the longitudinal edges of the segment. In other words, a dielectric portion may be situated on at least one longitudinal end of the segment. As a result, when the segments are longitudinally arranged, a discontinuous shielding arrangement may be formed along the longitudinal length of the central member 560. In other embodiments, a plurality of patches of shielding material may be formed on a surface of a central member segment. Additionally, although the central member 560 of FIG. 5H includes patches of shielding material formed on one or more surfaces, other suitable techniques may be utilized to incorporate shielding material into one or more central member segments as described in greater detail above.

FIG. 5I illustrates another example severed central member 570. The central member 570 may include any number of discrete segments that may be arranged in a longitudinal manner. Additionally, the central member 570 may include one or more longitudinal channels and, as desired, any number of second channels. In certain embodiments, at least two of the central member segments may be formed from different materials and/or may have a different construction. For example, a first segment 572A may be formed from a first set of one or more materials, and a second segment 572B may be formed from a second set of one or more materials. In one example embodiment, a first segment 572A may be formed from one or more polymeric materials, flame retardant materials and/or other suitable materials while a second segment 572B may be formed from one or more shielding materials (e.g., electrically conductive material, semi-conductive material, dielectric shielding material, etc.). A wide variety of other segment constructions may be utilized as desired. Additionally, each segment may have any suitable length and/or other dimensions.

Figure 6E:
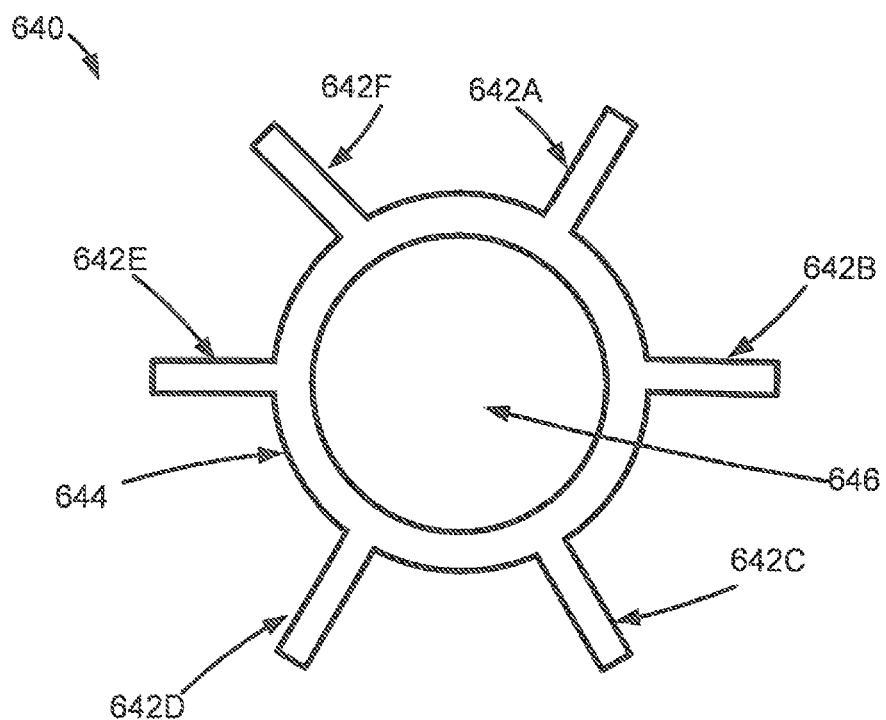

As desired in various embodiments, central members may be formed with a wide variety of suitable cross-sectional shapes and/or constructions. FIGS. 6A-6H illustrate cross-sectional views of example central members that may be utilized in accordance with various embodiments of the disclosure. FIG. 6A illustrates an example central member 600 having a rod shape. The central member 600 may have a circular or elliptical cross-section, and at least one longitudinal channel 602 may be formed through the central member 600. As shown, the longitudinal channel 602 may have a relatively circular cross-sectional shape; however, in other embodiments, the longitudinal channel 602 may be formed with other suitable shapes (e.g., rectangular, square, elliptical, etc.).

The central member 600 is illustrated as including a single longitudinal channel 602; however, in other embodiments such as those illustrated in FIGS. 6B-D and 6H, the central member 600 may include a plurality of longitudinal channels. Additionally, the central member 600 has a body portion with a relatively uniform thickness. In other embodiments, a thickness of the central member 600 may be varied at different locations at any given cross-sectional location. Further, the longitudinal channel 602 may be formed with a wide variety of suitable shapes and/or dimensions. As shown, the longitudinal channel 602 has a round or circular cross-sectional shape. In other embodiments, the longitudinal channel 602 may have an elliptical, rectangular, square, or other suitable shape.

FIG. 6B illustrates another example rod shaped central member 610 that includes a plurality of longitudinal channels 612, 614. Additionally, the central member 610 may include one or more internal ribs or dividers 616 positioned within an internal cavity. In certain embodiments, the internal rib(s) 616 may provide structural support to the central member 610 and/or assist the central member 610 in maintaining its shape. Additionally, the internal rib(s) 616 may divide an internal cavity into any desired number of longitudinal channels, such as the two longitudinal channels 612, 614 illustrated in FIG. 6B. With continued reference to FIG. 6B, the central member 610 is illustrated as being formed (e.g., molded from, extruded as, etc.) from one or more suitable shielding materials, such as semi-conductive or dielectric shielding material. Indeed, as set forth above, a central member 610 may be formed from any suitable material and/or groups of materials.

FIG. 6C illustrates another example rod shaped central member 620 that includes a plurality of longitudinal channels, such as the four depicted channels 622, 624, 626, 628. For central members with multiple longitudinal channels, the longitudinal channels may be arranged in any suitable configuration. For example, as illustrated in FIG. 6C, the longitudinal channels may be positioned in a cross arrangement. In other embodiments, such as the central member 610 illustrated in FIG. 6B, two or more longitudinal channels may be arranged in a side by side or top and bottom configuration. In other embodiments, longitudinal channels may be formed in one or more suitable rows. Other configurations of channels may be incorporated into central members as desired in other embodiments. Additionally, the central member and/or longitudinal channels may include any suitable dimensions.

In certain embodiments, a central member may have a relatively uniform body portion that is formed from the same material or group of materials. In other embodiments, different components of the central member body may be formed from different materials. For example, with reference to FIG. 6D, the internal rib(s) 632 or internal support structure may be formed from different materials than the outer rod-shaped or tube portion of the central member 630. In certain embodiments, the outer rod-shaped portion may be formed from one or more polymeric or dielectric materials (which may have shielding material formed on one or more surfaces), and the internal rib(s) 632 may be formed from and/or include one or more heat sink materials. For example, the internal rib(s) 632 may be formed from one or more metallic materials and/or include one or more longitudinally spaced metallic portions that function as heat sinks within the central member 630. Other suitable constructions and/or groups of materials may be utilized as desired in other embodiments.

FIG. 6E illustrates an example central member 640 that includes one or more prongs 642A-F or fins extended from a central portion 644. As shown, the central member 640 includes six prongs 642A-F extending from a central portion 644. However, as desired in other embodiments, any other suitable number of prongs may be utilized and/or one or more of the prongs may be offset such that it does not extend from a central point. Additionally, as desired, one or more extensions (not shown) may extend laterally from the ends of one or more of the prongs. The extensions may be configured to contact the outer jacket of a cable (or any intermediate shielding or other layer) and may assist in holding the central member 640 in place. Additionally, any number of longitudinal channels 646 may be formed within the central portion 644 and, in certain embodiments, within one or more of the prongs 642A-F.

Figure 6F:
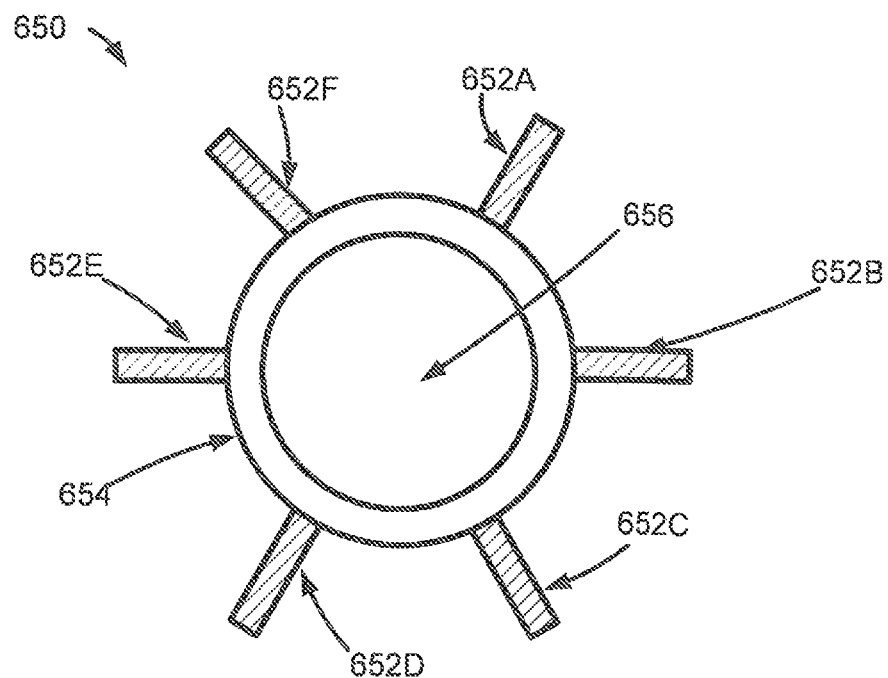
Figure 6G:
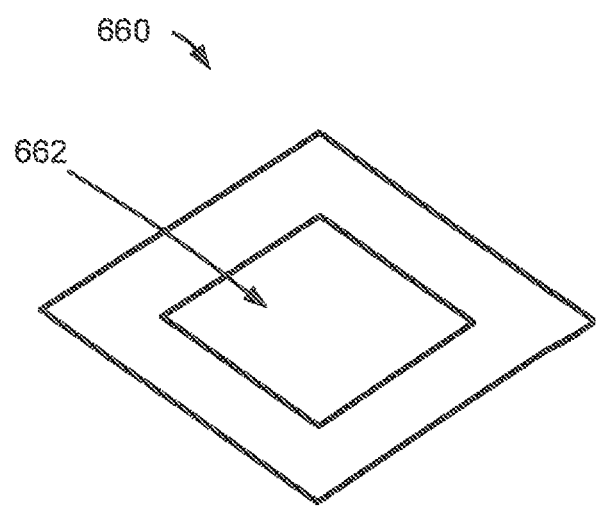
Figure 6H:
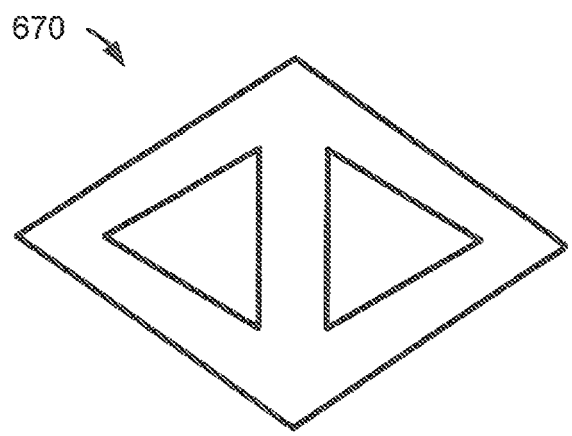

FIG. 6F illustrates another example central member 650 that includes one or more prongs 652A-F extending from a central portion 654. However, in contrast to the central member 640 of FIG. 6E, the prongs 652A-F of the central member 650 may be formed from a different material or group of materials than the central portion 654. As shown, the prongs 652A-F may be formed at least in part from shielding material, such as electrically conductive material. Additionally, in certain embodiments, the prongs 652A-F may function as heat sinks that serve to pull heat into one or more longitudinal channels 656 formed through the central member 650.

The central members illustrated in FIGS. 6A-6F all have either a rod-shaped or circular cross-section with optional prongs extending therefrom. In other embodiments, central members may be formed with a wide variety of other cross-sectional shapes. For example, FIG. 6N illustrates an example central member 660 having a diamond-shaped cross-section. The central member 660 may include any number of longitudinal channels formed through a body portion, such as the illustrated longitudinal channel 662 that also has a diamond shape. Other channels may include other shapes, and the various components of the central member 660 may include a wide variety of suitable dimensions. In other embodiments, as illustrated by the central member 670 depicted in FIG. 6H, one or more ribs or support segments may be incorporated into an internal cavity in order to form a plurality of longitudinal channels and/or to assist the diamond central member 670 in maintaining its shape. Much like the central member 630 of FIG. 6D, in certain embodiments, the ribs or support segments may be formed from one or more materials that are different from the material(s) utilized to form an outer portion of the central member 670. Any number of components (e.g., twisted pair components, etc.) may be positioned around a diamond-shaped central member. For example, four components may be incorporated into a cable and positioned adjacent to each of the four outer surfaces of a diamond-shaped central member.

A wide variety of other suitable central members may be utilized in other embodiments. These central members may include any suitable shapes and/or dimensions. Additionally, central members may include any of the features and/or combination of features described and illustrated above with respect to FIGS. 5A-5I. The central members discussed herein are provided by way of non-limiting example only.

Figure 7A:
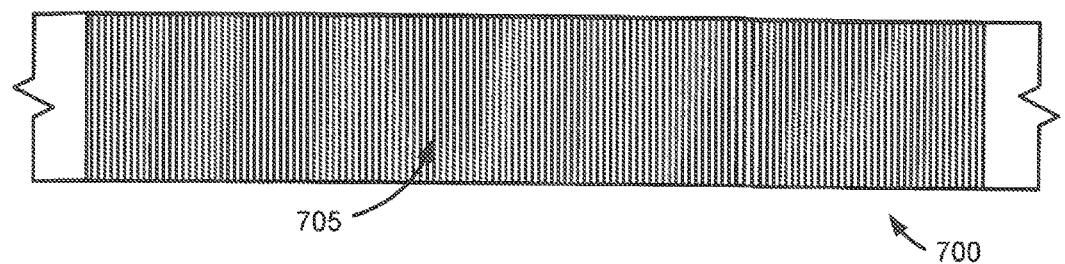
FIGS. 7A-7G are top level views of various configurations of electrically conductive material that may be incorporated into shield elements as desired in various embodiments of the disclosure.

As set forth above, a wide variety of different shielding configurations and/or arrangements of shielding material may be utilized in conjunction with central members, separators, shields, and/or other shield elements. FIGS. 7A-7G illustrate top level views of example shielding material configurations that may be utilized in various embodiments. These configurations are applicable to one or more central member surfaces (e.g., an outer surface, the surface of a longitudinal channel, etc.), separator surfaces, shielding layer surfaces, embedded layers of shielding material incorporating into a shield element, segments of a severed shield element, etc. With reference to FIG. 7A, an example shield element 770 may include relatively continuous shielding material 705. For example, a continuous patch of shielding material may be formed on a surface of the shielding element 770. As another example, a shielding structure 700 may be formed from a shielding material or impregnated with shielding material along its entire length.

Figure 7B:
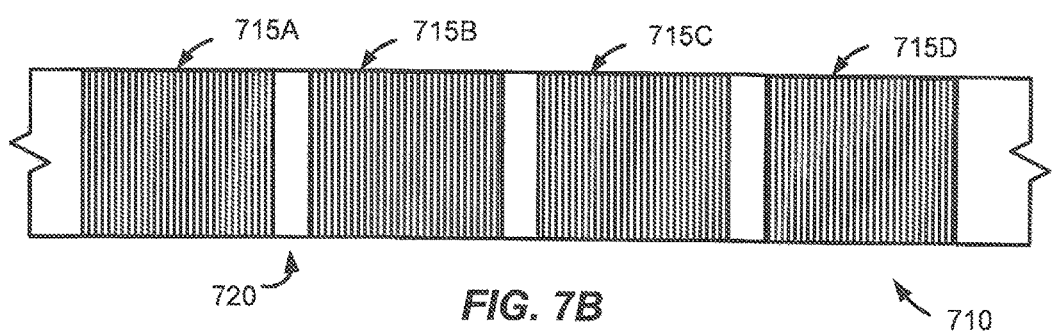

With reference to FIG. 7B, a top level view of another example shield element 710 is illustrated. The shield element 710 may include any number of rectangular patches of shielding material, such as patches 715A-D formed on a dielectric material or otherwise incorporated into the shield element. As desired in various embodiments, the patches 715A-D may include any desired lengths, and any desired gap 720 or separation distance may be provided between adjacent patches. In certain embodiments, the patches may be formed in accordance with a repeating pattern having a definite step or period. As desired, additional patches may be formed on an opposing side of the dielectric material to cover the gaps 720.

Figure 7C:
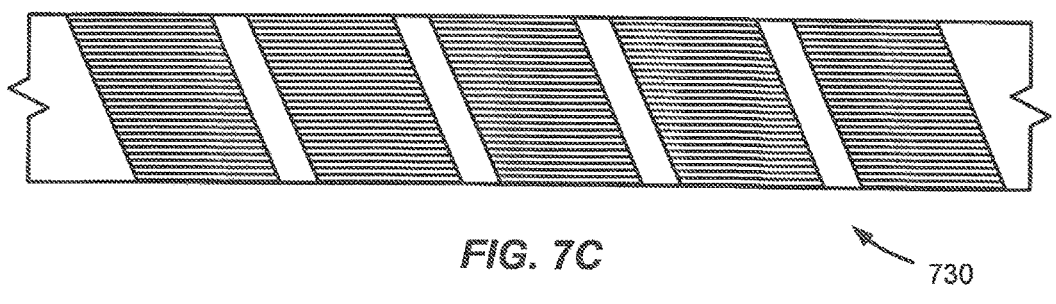
Figure 7D:
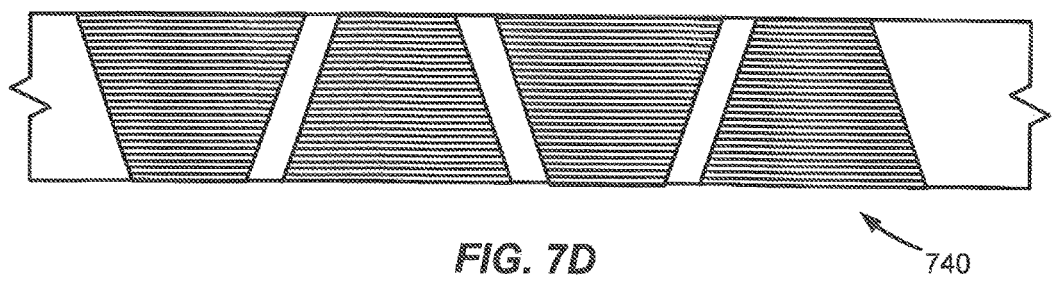

FIG. 7C illustrates a top level view of another example shield element 730. The shield element 730 may include any number of patches of shielding material having the shape of a parallelogram. In other words, the patches may be formed at an angle within one or more areas of the shield element 730. As shown, the patches may be formed at an acute angle with respect to the width dimension of the shield element 730. In certain embodiments, the acute angle facilitates manufacturing and/or enhances patch-to-substrate adhesion. Additionally, the acute angle may also facilitate the covering of opposing isolating spaces or gaps. In certain embodiments, benefit may be achieved when the acute angle is about 45 degrees or less. In other embodiments, benefit is achieved when the acute angle is about 35 degrees or less, about 30 degrees or less, about 25 degrees or less, about 20 degrees or less, or about 15 degrees or less. In other embodiments, benefit is achieved when the acute angle is between about 12 and 40 degrees. In certain embodiments, the acute angle may be in a range between any two of the degree values provided in this paragraph or a range bounded on a minimum or maximum end by one of the provided values. FIG. 7D illustrates a top level view of another example shield element 740 that may be utilized in various embodiments. The structure 740 may include any number of patches of shielding material having a trapezoidal shape. In certain embodiments, the orientation of adjacent trapezoidal patches may alternate. Similar to the patch pattern illustrated in FIG. 7C, the trapezoidal patches may provide manufacturing and/or shielding benefits.

Figure 7E:
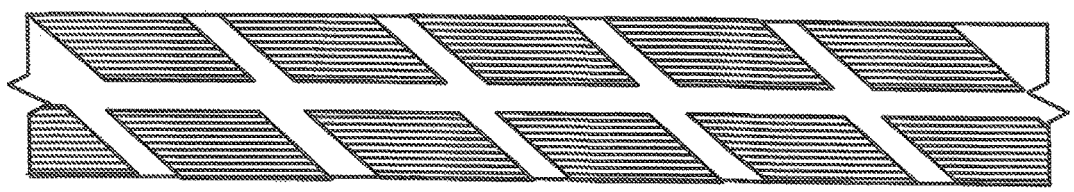

In certain embodiments, patches of shielding material may be formed across a dimension of a shield element, such as across a width dimension that is perpendicular to a longitudinally extending direction of the shield element. In other embodiments, multiple patches may be formed across a given dimension, such as a width dimension. FIG. 7E illustrates a top level view of an example shield element 750 in which multiple patches are formed across a width dimension. As desired, patches may be discrete or discontinuous along any dimension of the shield element 750 and/or across multiple dimensions (e.g., a width and a length dimension). Additionally, any number of patches may be formed across a given dimension. Each patch may have a wide variety of suitable dimensions (e.g., widths, lengths, etc.), and/or a wide variety of suitable separation gaps may be formed between adjacent patches.

Figure 7F:
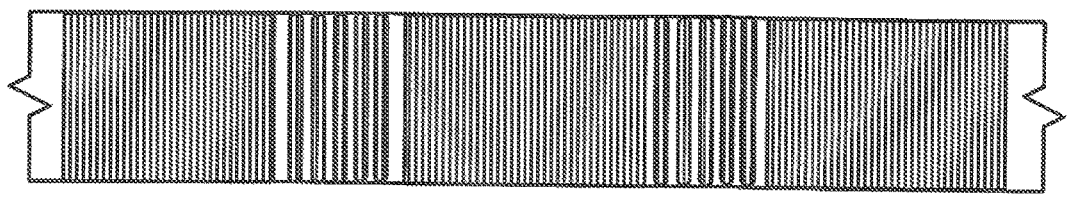

FIG. 7F illustrates a top level view of an example shield element 760 in which one or more respective microcuts are utilized to form gaps between adjacent patches of shielding material. In certain embodiments, the width of each of these microcuts may be less than or equal to approximately 0.25 mm. These relatively narrow microcuts may limit the leakage of the shield element 760, and therefore, reduce noise during electrical transmission using a cable. In certain embodiments, a series of microcuts may be placed in relatively close proximity to one another. For example, a series of microcuts may be formed as an alternative to a traditional space or gap between patches of shielding material. As one example, a conventional discontinuous shield may include gaps or spaces between adjacent patches that are at least approximately 0.050 inches (approximately 1.27 mm) wide. By contrast, a plurality of relatively narrow or fine microcuts (e.g., microcuts of approximately 0.25 mm, etc.) may be formed in an approximately 0.050 inch wide portion (or any other desired width) of a shield element. Additionally, it is noted that the use of singular or isolated microcuts within a shield element may allow electricity to are across the microcuts, thereby leading to a safety hazard. However, a plurality of microcuts positioned or formed in relatively close proximity to one another may limit safety risks due to electrical arcing. Any electrical arcing across the microcut gaps will likely burn up or destroy the electrically conductive material between the closely spaced microcuts, thereby breaking or severing the electrical continuity of the shield element and preventing current from propagating down the shield element. In other words, the microcuts may be spaced and/or formed to result in a shield element that includes shielding material having a sufficiently low mass such that the shielding material will fuse or melt when current is applied.

Although the examples above describe situations in which conventional spaces or gaps are respectively replaced with a series of microcuts, a wide variety of other suitable configurations of microcuts may be utilized in other embodiments. For example, a shield element may include microcuts continuously spaced in close proximity to one another along a longitudinal length of the shield element. In other embodiments, sections or patches of microcuts may be spaced at regular intervals or in accordance with any desired pattern. Each section or patch may include at least two microcuts. A wide variety of suitable patterns may be formed by microcuts. For example, a section of microcuts (e.g., one section of a repeating pattern, etc.) may include microcuts having a perpendicular line pattern, a dashed vertical line pattern, a square pattern, an inverse square pattern, a diamond-shaped pattern, an inverse diamond-shaped pattern, a checkerboard pattern, an angled line pattern, a curved line pattern, or any other desired pattern. As another example, a section of microcuts may include microcuts that form one or more alphanumeric characters, graphics, and/or logos. In this regard, product identification information, manufacturer identification information, safety instructions, and/or other desired information may be displayed on a shield element. In yet other embodiments, sections or patches of microcuts may be positioned in random locations along a shield element. Additionally, a wide variety of suitable methods and/or techniques may be utilized to form microcuts. For example, one or more lasers may be utilized to form microcuts.

Figure 7G:
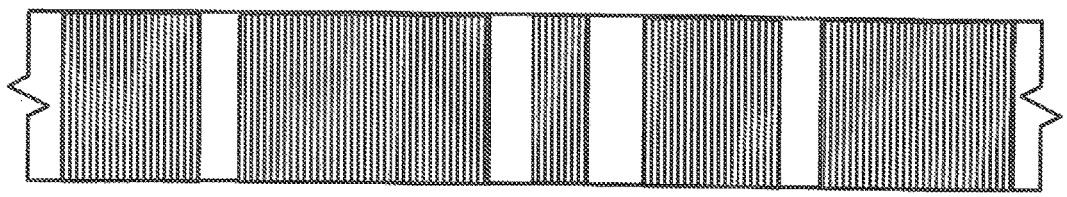

FIG. 7G depicts a top level view of another example shield element 770 that may be utilized in various embodiments. The shield element 770 may include a plurality of discontinuous patches or sections of shielding material that are formed in a random or pseudo-random manner. A wide variety of other suitable patch configurations and/or other configurations of shielding material may be utilized as desired in other embodiments, and the configurations discussed herein are provided by way of non-limiting example only.

Conditional language, such as, among others, "can," "could." "might," or "may," unless specifically stated otherwise, or otherwise understood within the context as used, is generally intended to convey that certain embodiments could include, while other embodiments do not include, certain features, elements, and/or operations. Thus, such conditional language is not generally intended to imply that features, elements, and/or operations are in any way required for one or more embodiments or that one or more embodiments necessarily include logic for deciding, with or without user input or prompting, whether these features, elements, and/or operations are included or are to be performed in any particular embodiment.

Many modifications and other embodiments of the disclosure set forth herein will be apparent having the benefit of the teachings presented in the foregoing descriptions and That which is claimed:

1. A cable comprising:
a central member extending lengthwise along a longitudinal length of the cable, the central member comprising a channel extending lengthwise and defining a longitudinal cavity through the central member, the channel comprising a cross-sectional area of at least approximately 0.8 mm$^2$;
a plurality of unjacketed twisted pair components formed around the central member, each twisted pair component comprising a plurality of twisted pairs of individually insulated electrical conductors; and
a jacket formed around the central member and the plurality of twisted pair components.

2. The cable of claim 1, wherein at least one of the plurality of twisted pair components further comprises a shield layer formed around at least one of the plurality of twisted pairs and in direct contact with the central member, the shield layer comprising electrically conductive material.

3. The cable of claim 1, further comprising electrically conductive material incorporated into the central member.

4. The cable of claim 3, wherein the electrically conductive material is formed on at least one of (i) the surface of the channel or (ii) an outer surface of the central member.

5. The cable of claim 3, wherein the electrically conductive material comprises a plurality of discontinuous patches of electrically conductive material.

6. The cable of claim 1, wherein the channel comprises a first channel, and further comprising:
at least one second channel extending from the first channel to an outer periphery of the central member.

7. The cable of claim 6, wherein the at least one second channel comprises a plurality of second channels positioned at respective cross-sectional locations along the longitudinal length.

8. The cable of claim 1, wherein the channel comprises a first channel and the cavity comprises a first cavity, and further comprising a second channel extending lengthwise through the central member and defining a second longitudinal cavity through the central member.

9. The cable of claim 1, wherein the central member further comprises a plurality of prongs that extend from a central portion, each prong extending between two of the plurality of twisted pair components.

10. The cable of claim 1, wherein the plurality of twisted pair components comprises six twisted pair components.

11. A cable comprising:
a central member extending lengthwise along a longitudinal length of the cable, the central member comprising a body portion and at least one channel extending lengthwise to define a longitudinal cavity through the body portion, the at least one channel comprising a cross-sectional area of at least approximately 0.8 mm$^2$;
a plurality of unjacketed twisted pair components formed in a ring around the central member, each component comprising a plurality of twisted pairs of individually insulated electrical conductors; and
a jacket formed around the central member and the plurality of twisted pair components.

12. The cable of claim 11, wherein at least one of the plurality of twisted pair components further comprises a shield layer formed around at least one of the plurality of twisted pairs and in direct contact with the central member, the shield layer comprising electrically conductive material.

13. The cable of claim 11, further comprising electrically conductive material incorporated into the central member.

14. The cable of claim 13, wherein the electrically conductive material comprises a plurality of discontinuous patches of material.

15. The cable of claim 11, wherein the at least one channel comprises a first channel, and further comprising at least one second channel extending from the first channel to an outer periphery of the central member.

16. The cable of claim 15, wherein the at least one second channel comprises a plurality of second channels positioned at respective cross-sectional locations along the longitudinal length.

17. A cable comprising:
a jacket defining a cable core;
an enclosed cooling tube positioned within the cable core and configured to longitudinally transmit a cooling substance provided to the cooling tube from at least one end of the cable; and
a plurality of unjacketed twisted pair components positioned within the cable core around the cooling tube, each of the twisted pair components comprising a plurality of twisted pairs of individually insulated electrical conductors; and
a jacket formed around the central member and the plurality of twisted pair components.

18. The cable of claim 17, wherein at least one of the plurality of twisted pair components further comprises a shield layer comprising shielding material, the shield layer formed around at least one of the plurality of twisted pairs and in contact with the cooling tube.

19. The cable of claim 17, further comprising shielding material incorporated into the cooling tube.

20. The cable of claim 17, wherein the cooling tube comprises at least one element extending from a central portion between two of the plurality of twisted pair components.

\* \* \* \* \*